US009688897B2

(12) United States Patent
Hata et al.

(10) Patent No.: US 9,688,897 B2
(45) Date of Patent: Jun. 27, 2017

(54) CARBON NANOTUBE COMPOSITE MATERIAL AND THERMAL CONDUCTOR

(71) Applicant: NATIONAL INSTITUTE OF ADVANCED INDUSTRIAL SCIENCE AND TECHNOLOGY, Tokyo (JP)

(72) Inventors: Kenji Hata, Tsukuba (JP); Seisuke Ata, Tsukuba (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

(21) Appl. No.: 15/337,450

(22) Filed: Oct. 28, 2016

(65) Prior Publication Data
US 2017/0107416 A1 Apr. 20, 2017

Related U.S. Application Data

(63) Continuation-in-part of application No. 14/246,195, filed on Apr. 7, 2014, now abandoned, which is a continuation of application No. PCT/JP2012/076009, filed on Oct. 5, 2012.

(30) Foreign Application Priority Data

Oct. 5, 2011 (JP) ................................. 2011-220832

(51) Int. Cl.
C09K 5/14 (2006.01)
D01F 9/145 (2006.01)
C08J 5/00 (2006.01)
C08J 5/04 (2006.01)
C08K 3/04 (2006.01)
C08K 7/06 (2006.01)
B82Y 30/00 (2011.01)

(52) U.S. Cl.
CPC ................ C09K 5/14 (2013.01); B82Y 30/00 (2013.01); C08J 5/005 (2013.01); C08J 5/042 (2013.01); C08K 3/04 (2013.01); C08K 7/06 (2013.01); D01F 9/145 (2013.01); Y10S 977/742 (2013.01)

(58) Field of Classification Search
None
See application file for complete search history.

(56) References Cited

U.S. PATENT DOCUMENTS

| 5,194,484 | A | 3/1993 | Logothetis et al. |
| 2007/0004862 | A1 | 1/2007 | Park et al. |
| 2008/0096293 | A1 | 4/2008 | Suhir et al. |
| 2011/0008617 | A1* | 1/2011 | Hata ..................... B82Y 30/00 |
| | | | 428/341 |
| 2011/0024694 | A1* | 2/2011 | Shah ........................ C08J 5/042 |
| | | | 252/502 |
| 2011/0233479 | A1 | 9/2011 | Korzhenko et al. |
| 2013/0337707 | A1* | 12/2013 | Hata ..................... C01B 31/00 |
| | | | 442/1 |

FOREIGN PATENT DOCUMENTS

| CN | 101017067 A | 8/2007 | |
| CN | 101250059 A | 8/2008 | |
| EP | 2 383 225 A1 | 11/2011 | |
| JP | 3-200397 A | 9/1991 | |
| JP | 5-235217 A | 9/1993 | |
| JP | 10-139893 A | 5/1998 | |
| JP | 2002-97375 A | 4/2002 | |
| JP | 2003-12939 A | 1/2003 | |
| JP | 2005-200620 A | 7/2005 | |
| JP | 2007-039667 A | 2/2007 | |
| JP | 2008-24800 A | 2/2008 | |
| JP | 2010-185032 A | 8/2010 | |
| WO | 2010/076885 A1 | 7/2010 | |
| WO | WO 2012081601 A1 * | 6/2012 | ............. C01B 31/00 |

OTHER PUBLICATIONS

International Search Report mailed Nov. 20, 2012 for PCT/JP2012/076009 to National Institute of Advanced Industrial Science and Technology filed Oct. 5, 2012.
International Preliminary Examination Report of Aug. 5, 2013 for PCT International Application No. PCT/JP2012/076009, International Filing Date Oct. 5, 2012.
International Preliminary Report on Patentability of Nov. 20, 2012 for PCT International Application No. PCT/JP2012/076009, International Filing Date Oct. 5, 2012.
English translation of International Preliminary Report on Patentability Chapter II for application No. PCT/JP2012/076009.
Office Action issued on Jul. 28, 2015 from SIPO in connection with the corresponding Chinese Patent Application No. 201280049216.6.
Office Action issued on Mar. 17, 2016 from SIPO in connection with the corresponding Chinese Patent Application No. 201280049216.6.
Minus, et al. "The processing, properties, and structure of carbon fibers", JOM, 57 (2), 52-58, Feb. 2005.

(Continued)

Primary Examiner — Christopher M Rodd
(74) Attorney, Agent, or Firm — Hauptman Ham, LLP

(57) ABSTRACT

A CNT composite material includes a CNT group and carbon fibers dispersed in a matrix, the CNT composite material includes 0.01 wt % or more and 30 wt % or less of CNT aggregate. The CNT group includes a three dimensional network structure with a size of 10 μm or more and has a maximum distribution range of a differential pore volume of 0.01 μm or more and 10 μm or less in a range of 4 nm or more and 1000 μm or less of a pore diameter. The carbon fibers have a maximum distribution range of a differential pore volume of 1 μm or more and 100 μm or less in a range of 4 nm or more and 1000 μm or less of a pore diameter. A total specific surface area of the CNT aggregate and the carbon fibers is 10 $m^2/g$ or more and 500 $m^2/g$ or less.

3 Claims, 15 Drawing Sheets

(56) References Cited

OTHER PUBLICATIONS

Gupta, et al. "Polymer Nanocomposite Handbook" p. 486, Jul. 20, 2009.
Lasance, "The thermal conductivity of rubbers and elastomers", Electronics Cooling Magazine, Nov. 2001.
Xiong et al. "Aligned millimeter long carbon nanotube arrays grwon on single crystal magnesia", Carbon, 44, p. 969-973, Apr. 2006.
Office Action issued on Sep. 1, 2016 from SIPO in connection with the Chinese Patent Application No. 201280049216.6.

\* cited by examiner

| | | 1 | 2 | 3 | 4 | 5 | 6 | 7 | 8 | 9 |
|---|---|---|---|---|---|---|---|---|---|---|
| | Matrix | Fluoro-carbon Rubber | Fluoro-carbon Rubber | Silicone | ABS | Fluoro-carbon Rubber | Fluoro-carbon Rubber | Fluoro-carbon Rubber | Hydrin rubber | Acrylic rubber |
| AMOUNT | Weight percentage of matrix (wt%) | 76.2 (80/1.05) | 66.7 (70/1.05) | 76.2 (80/1.05) | 76.2 (80/1.05) | 60 (63/1.05) | 57 (60/1.05) | 76.2 (80/1.05) | 76.2 (80/1.05) | 76.2 (80/1.05) |
| | Weight percentage of carbon fiber (wt%) | 19.0 (20/1.05) | 28.6 (30/1.05) | 19.0 (20/1.05) | 19.0 (20/1.05) | 19.0 (20/1.05) | 19.0 (20/1.05) | 19.0 (20/1.05) | 19.0 (20/1.05) | 19.0 (20/1.05) |
| | Type of filler | CNT by the present production method | CNT by the present production method | CNT by the present production method | CNT by the present production method | CNT by the present production method | CNT by the present production method | CNT by the present production method | CNT by the present production method | CNT by the present production method |
| | Weight percentage of CNT (wt%) | 4.8 (5/1.05) | 4.8 (5/1.05) | 4.8 (5/1.05) | 4.8 (5/1.05) | 6.7 (7/1.05) | 9.5 (10/1.05) | 4.8 (5/1.05) | 4.8 (5/1.05) | 4.8 (5/1.05) |
| EVALUATION RESULTS | Thermal Conductivity (W/mk) In-plane thermal conductivity (W/mk) | 23.5 | 19.3 | 16.5 | 14.3 | 27.2 | 29.8 | 105 | 87 | 72 |
| | thickness direction thermal conductivity (W/mk) | 2.24 | 0.96 | 1.12 | 1.43 | 2.56 | 2.84 | 1.51 | 1.24 | 1.76 |
| | front surface volume resistance/rear surface volume resistance (Ω/cm) | 0.05/0.05 | 0.03/0.03 | 0.05/0.05 | 0.12/0.15 | 0.04/0.04 | 0.03/0.03 | $1.2\times10^{-4}$ | $7.2\times10^{-4}$ | $3.8\times10^{-3}$ |
| | Hardness front/rear (N/mm²) | 0.68/2.50 | 0.24/0.43 | No information | No information | No information | No information | No information | No information | No information |
| | Density (g/cm³) | 1.92 | 1.93 | 1.35 | 1.12 | 1.92 | 1.91 | 1.85 | 0.86 | 0.95 |
| | Diameter of carbon fiber (μm) | 10 | 10 | 10 | 10 | 10 | 10 | 10 | 10 | 10 |
| | Length of carbon fiber (μm) | 213 | 213 | 213 | 213 | 213 | 213 | 1000 | 1000 | 1000 |
| | Thermal conductivity of carbon fiber (W/mk) | 627 | 627 | 627 | 627 | 627 | 627 | 627 | 627 | 627 |
| | Average diameter of CNT (nm) | 3.0 | 3.0 | 3.0 | 3.0 | 3.0 | 3.0 | 3.0 | 3.0 | 3.0 |
| | Purity of CNT (%) | 99.98 | 99.98 | 99.98 | 99.98 | 99.98 | 99.98 | 99.98 | 99.98 | 99.98 |
| | G/D ratio | 3.92 | 1.75 | 3.31 | 3.5 | 3.23 | 3.76 | 3.42 | 3.42 | 2.98 |
| | Thermal conductivity of CNT (W/mk) | 80 | 80 | 80 | 80 | 80 | 80 | 80 | 80 | 80 |
| | Diameter of CNT group | 200 | 200 | 200 | 200 | 200 | 200 | 200 | 200 | 200 |
| | Thermal conductivity of matrix material (W/mk) | 0.16 | 0.16 | 1.5 | 0.20 | 0.16 | 0.16 | 0.20 | 0.20 | 0.20 |

FIG.13B

COMPARATIVE EXAMPLES

| | | 1 | 2 | 3 | 4 | 5 | 6 | 7 | 8 |
|---|---|---|---|---|---|---|---|---|---|
| AMOUNT | Matrix | Fluoro-carbon Rubber | Fluoro-carbon Rubber | Fluoro-carbon Rubber | Fluoro-carbon Rubber | Fluoro-carbon Rubber | Fluoro-carbon Rubber | Fluoro-carbon Rubber | Fluoro-carbon Rubber |
| | Weight percentage of matrix (wt%) | 95 | 80 | 90 | 70 | 76.2 (80/1.05) | 76.2 (80/1.05) | 76.2 (80/1.05) | 76.2 (80/1.05) |
| | Weight percentage of carbon fiber (wt%) | 0 | 20 | 10 | 30 | 19.0 (20/1.05) | 19.0 (20/1.05) | 19.0 (20/1.05) | 19.0 (20/1.05) |
| | Type of filler | CNT by the present production method | - | - | - | Multi-walled CNT (Nanocyl) | Single-walled CNT (HiPCO) | AlN | Graphene |
| | Weight percentage of CNT (wt%) | 5 | 0 | 0 | 0 | 4.8 (5/1.05) | 4.8 (5/1.05) | 4.8 (5/1.05) | 4.8 (5/1.05) |
| | Thermal Conductivity (W/mk) — In-plane thermal conductivity (W/mk) | 5.15 | 5.49 | 2.08 | 8.30 | 8.0 | 6.2 | 2.5 | 4.8 |
| | Thermal Conductivity (W/mk) — thickness direction thermal conductivity (W/mk) | 0.046 | 0.76 | 0.094 | 0.56 | 1.2 | 1.4 | 2.8 | 2.2 |
| EVALUATION RESULTS | front surface volume resistance/rear surface volume resistance (Ω/cm) | 0.10/0.10 | ∞/4.55 | ∞/15.5 | ∞/4.81 | 0.05/0.05 | 0.05/0.05 | 3.1×10⁻³ | 6.5×10⁻³ |
| | Hardness front/rear (N/mm²) | No information | ~/0.19 | 0.05/0.08 | No information | No information | No information | No information | No information |
| | Density (g/cm³) | 1.91 | 1.91 | 1.91 | 1.91 | 1.94 | 1.93 | 1.95 | 1.94 |
| | Diameter of carbon fiber (μm) | - | 10 | 10 | 10 | 10 | 10 | 10 | 10 |
| | Length of carbon fiber (μm) | - | 213 | 213 | 213 | 213 | 213 | 213 | 213 |
| | Thermal conductivity of carbon fiber (W/mk) | - | 627 | 627 | 627 | 627 | 627 | 627 | 627 |
| | Average diameter of CNT (nm) | 3.0 | 3.0 | 3.0 | 3.0 | 9.0 | 0.8-1.2 | 3.0 | 3.0 |
| | Purity of CNT (%) | 99.98 | 99.98 | 99.98 | 99.98 | 99.98 | 99.98 | 99.98 | 99.98 |
| | G/D ratio | 3.48 | 1.70 | 2.61 | 1.75 | 3.92 | 3.92 | 3.92 | 3.92 |
| | Thermal conductivity of CNT (W/mk) | 80 | - | - | - | No information | No information | No information | No information |
| | Diameter of CNT group | 200 | - | - | - | 200 | 200 | No information | No information |
| | Thermal conductivity of matrix material (W/mk) | 0.16 | 0.16 | 0.16 | 0.16 | 0.16 | 0.16 | 0.16 | 0.16 | ured by a mercury intrusion porosimeter. A total specific surface area of the carbon nanotube group and the carbon fibers measured by using the Brunauer, Emmett and Teller method is $10 \text{ m}^2/\text{g}$ or more and $500 \text{ m}^2/\text{g}$ or less.

CARBON NANOTUBE COMPOSITE MATERIAL AND THERMAL CONDUCTOR

CROSS REFERENCE TO RELATED APPLICATIONS

This application is a continuation in part of U.S. patent application Ser. No. 14/246,195, filed on Apr. 7, 2014, and this application is based upon and claims the benefit of priority from the prior Japanese Patent Application No. 2011-220832, filed on Oct. 5, 2011 and PCT Application No. PCT/JP2012/076009, filed on Oct. 5, 2012, the entire contents of which are incorporated herein by reference.

FIELD

The present invention relates to a carbon nanotube composite material having carbon nanotubes dispersed in a matrix. In addition, the present invention relates to a thermal conductor having the carbon nanotube composite material.

BACKGROUND

In recent years, there is progress in speeding up the processing speed during operation in addition to high integration of CPU or LED semiconductor devices and there is a tendency whereby the amount of heat generated during operation of these devices increases compared to conventional devices. As a result, if heat which is generated during operation of a semiconductor device is not efficiently released to the outside, there is a risk that the internal temperature of the semiconductor device during operation may exceed the limits of the operating temperature. Therefore, cooling by interposing a heat transfer composite material having a thermally conductive filler dispersed in a matrix between heat generating components and heat dissipation components is generally performed.

In the case where the particle shape of a thermally conductive filler is not spherical but fibrous, the surface area per unit weight increases. As a result, in the case where it is filled into a resin material, it is easy for thermally conductive filler particles to contact with each other and easily form a path which becomes a heat path. Therefore, when a fibrous shaped thermally conductive filler is filled compared to the case of filling a spherical shaped thermally conductive filler, it is possible to obtain a high thermal conductivity, as described in Japanese Unexamined Patent Application Publication No H10-139893.

However, in order to obtain a high thermal conductivity, in the case where the amount of the thermally conductive filler which is filled is increased, there is a problem in that a resin composition rapidly becomes hard and the characteristics of the composite material significantly deteriorate. In order to solve such a problem, Japanese Unexamined Patent Application Publication No H3-200397 describes using two thermally conductive fillers in combination. That is, a plate-shaped filler is distributed in a layer shape in the longitudinal direction of a sheet and in multi-layers in the thickness direction forming a filler contained resin sheet with the particle shaped filler distributed between layers is described in the Japanese Unexamined Patent Application Publication No H3-200397.

However, with the miniaturization of electronic components in recent years and the progress in use of plastic parts, particularly in consumer electronic devices, a composite material having higher heat transfer properties has become necessary. Therefore, a carbon fibrous filler having excellent heat conductivity, for example carbon nanotubes or carbon fibers are attracting attention as a filler and especially a heat conductive filler.

As a heat transfer composite material which uses these carbon fibers as a thermally conductive filler, for example, a heat transfer material in which carbon fibers coated with a film having electrical insulating properties are uniformly dispersed in a synthetic resin having compatibility with the coating is described in Japanese Unexamined Patent Application Publication No H5-235217.

In the conventional technology as described above, when carbon fibers are added at a high filling amount, the carbon fibers with a high density begin to settle during the manufacturing process, and there is a problem whereby in the heat transfer composite material, non-uniformity of the distribution of the carbon fibers is generated between the front and rear surfaces. In such cases, there is a problem whereby heat resistance between heat generating components and heat dissipation components increases and cooling can no longer be performed efficiently. In addition, the creation of a composite material having a high thermal conductivity has been desired for sufficient cooling in small electronic devices and LED's.

SUMMARY

The present invention aims to solve the problems of the conventional technology as described above by providing a carbon nanotube composite material having excellent uniformity and a high thermal conductivity and a thermal conductor.

According to one embodiment of the present invention, a carbon nanotube composite material having a carbon nanotube group and carbon fibers dispersed in a matrix is provided. The carbon nanotube composite material includes 0.01 wt % or more and 30 wt % or less of the carbon nanotube respect to 100 wt % of the carbon nanotube composite material. The carbon nanotube group includes a three dimensional network structure with a size of 10 µm or more observed by using a two-dimensional image, the carbon nanotube group enters between the carbon fibers and connects between the carbon fibers, and/or the carbon nanotube group links between the carbon fibers, and/or crosslinks the carbon fibers between the carbon fibers, the carbon nanotube group enters between the carbon fibers and is arranged by being mutually entangled. The carbon nanotube group has a maximum distribution range of a differential pore volume of 0.01 µm or more and 10 µm or less in a range of 4 nm or more and 1000 µm or less of a pore diameter measured by a mercury intrusion porosimeter. The carbon fibers have a maximum distribution range of a differential pore volume of 1 µm or more and 100 µm or less in a range of 4 nm or more and 1000 µm or less of a pore diameter meas In the carbon nanotube composite material, the carbon nanotube aggregate has a nonwoven cloth shape and a layer shape by extending in an approximately perpendicular direction with respect to the thickness direction of the carbon nanotube composite.

In the carbon nanotube composite material, the carbon nanotube group supports the carbon fibers and sedimentation of the carbon fibers is prevented thereby.

In the carbon nanotube composite material, the carbon nanotube group has a three dimensional mesh structure.

In the carbon nanotube composite material, a size of the carbon nanotube group is 10 µm or less.

The carbon nanotube composite material includes an in-plane direction where thermal conductivity becomes 10 W/mK or more and a thickness direction where thermal conductivity becomes 0.5 W/mK or more, and in a first surface and a second surface opposite the thickness direction of the carbon nanotube composite material a ratio of sheet resistance of the second surface to sheet resistance of the first surface is 0.2 or more and 5 or less.

Hardness of the carbon nanotube composite material is 0.01 N/mm$^2$ or more and 10 N/mm$^2$ or less.

In the carbon nanotube composite material, the carbon fibers are arranged mainly in a plane direction of the carbon nanotube composite material and extend to an in-plane of the carbon nanotube composite material.

The carbon nanotube composite material has a sheet shape.

The carbon nanotube composite material has a film shape.

The carbon nanotube composite material has a pallet shape.

In the carbon nanotube composite material, the thermal conductivity of the carbon fibers is at least 300 W/mK.

In the carbon nanotube composite material, the carbon fibers have a thermal conductivity equal to or more than the thermal conductivity of the carbon nanotubes In the carbon nanotube composite material, an average diameter of the carbon fibers is 1000 times greater or more and 10000 times greater or less than an average diameter of the carbon nanotubes.

In the carbon nanotube composite material, the carbon fibers are pitch based carbon fibers.

In the carbon nanotube composites, an average length of the carbon fibers is 100 µm or more.

In the carbon nanotube composites, carbon purity by an analysis using fluorescence X-rays of the carbon nanotubes is 90 wt % or more.

In the carbon nanotube composite material, a length of the carbon nanotubes is 0.1 µm or more.

In the carbon nanotube composite material, a G/D ratio of the carbon nanotubes is 3 or more when a maximum peak intensity in the range of 1560 cm$^{-1}$ or more and 1600 cm$^{-1}$ or less is G and a maximum peak intensity in the range of 1310 cm$^{-1}$ or more and 1350 cm$^{-1}$ or less is D in a spectrum obtained in a measurement performed by a resonance Raman scattering measurement method.

In the carbon nanotube composite, the matrix is a resin.

In the carbon nanotube composite material, the resin is formed from at least one of silicone-based resins, modified silicone-based resins, acrylic-based resins, chloroprene-based resins, polysulfide-based resins, polyurethane-based resins, polyisobutyl-based resins and fluorosilicone-based resins.

In the carbon nanotube composite, the matrix is an elastomer.

In the carbon nanotube composite, the elastomer is one type or more selected from natural rubber, epoxidized natural rubber, styrene-butadiene rubber, nitrile rubber, chloroprene rubber, ethylene propylene rubber, butyl rubber, chloro-butyl rubber, acrylic rubber, silicone rubber, fluorocarbon rubber, butadiene rubber, epoxidized butadiene rubber, epichlorohydrin rubber, urethane rubbers, polysulfide rubber or olefin, polyvinyl chloride, polyester, polyurethane, polyamide and styrene-based thermoplastic elastomers.

In the carbon nanotube composite, the matrix includes a fluorocarbon rubber.

In addition, according to one embodiment of the present invention, a thermal conductor is provided arranged with the carbon nanotube composite material according to any one of the above.

BRIEF EXPLANATION OF THE DRAWINGS

FIG. 13A is a table showing the characteristics of a carbon nanotube composite material related to Examples;

FIG. 13B is a table showing the characteristics of a carbon nanotube composite material related to Comparative examples;

Figure 1A:
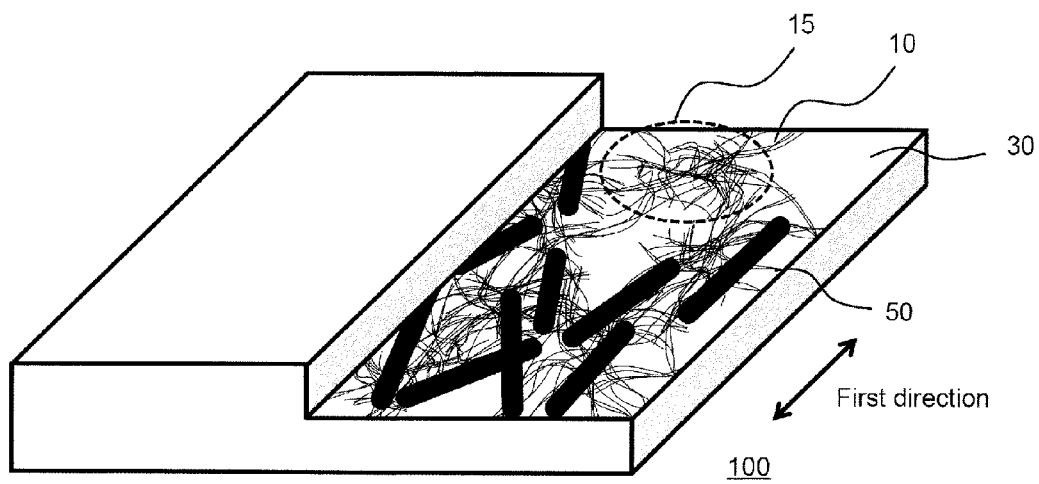
FIG. 1A is a schematic diagram of a carbon nanotube composite material 100 according to one embodiment of the present invention and a view of one part cut from the carbon nanotube composite material 100 to expose the interior.

EXPLANATION OF THE REFERENCE SYMBOLS 10 carbon nanotubes, 15 CNT group, 30 matrix, 50 carbon fiber, 100 carbon nanotube composite material, 200 carbon nanotube composite material, 210 carbon nanotube composite material, 220 carbon nanotube composite material, 230 carbon nanotube composite material, 240 carbon nanotube composite material, 250 carbon nanotube composite material, 260 carbon nanotube composite material, 270 carbon nanotube composite material, 280 carbon nanotube composite material, 900 carbon nanotube composite material, 910 carbon nanotube composite material, 920 carbon nanotube composite material, 930 carbon nanotube composite material, 940 carbon nanotube composite material, 950 carbon nanotube composite material, 960 carbon nanotube composite material, 970 carbon nanotube composite material.

EMBODIMENTS

The carbon nanotube composite material and the thermal conductor of the present invention are explained below while referring to the drawings. The carbon nanotube composite material and the thermal conductor of the present invention are not to be construed as being limited to the description of the embodiments and examples shown below. In the drawings referenced in the embodiments and examples described below, the same reference numerals are given to parts having similar functions or the same parts and repetitive explanations are omitted.

As described above, in conventional heat transfer materials, it was difficult to uniformly disperse carbon fibers in a matrix. In addition, conventionally, it was difficult to disperse carbon nanotubes (hereinafter, referred to as CNT) in a matrix and it was difficult to achieve a heat transfer material which can sufficiently exhibit the characteristics of the CNT and the carbon fibers which have excellent heat conductivity properties. As a result of keen studies, the present inventors have found that by dispersing CNT in a matrix and forming a bulky three-dimensional network structure where the CNT supports the carbon fibers, a method of dispersing the carbon fibers uniformly in the matrix was conceived. Ideas for a structure between the CNT and carbon fibers in a matrix have not conventionally been reported.

A carbon nanotube composite material related to the present invention is formed by dispersing CNT and carbon fibers in a matrix. Here, the carbon nanotube composite material related to the present invention is formed by forming a carbon nanotube group (hereinafter referred to as CNT group) consisting of a plurality of CNTs, the CNT group enters between the carbon fibers and the carbon fibers and CNT groups connect together to form a network. When the plurality of CNTs forming the CNT group enter between the carbon fibers, the CNT group provides a better contact between the carbon fibers and a carbon nanotube composite material with high thermal conductivity is realized.

In addition, since the CNT group supports the carbon fibers with a certain weight compared to the CNT, sedimentation of the carbon fibers is prevented and thus the carbon fibers are uniformly dispersed in the carbon nanotube composite material related to the present invention and it is possible to obtain a carbon nanotube composite material having excellent uniformity.

Figure 1B:
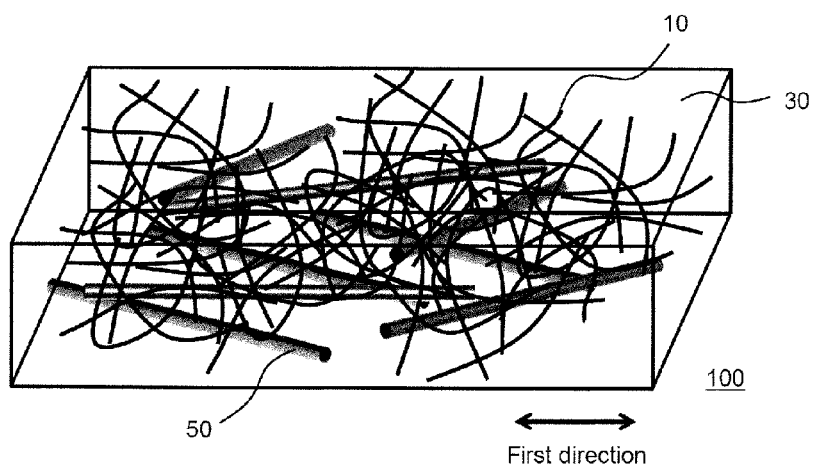
FIG. 1B is a schematic diagram of a carbon nanotube composite material 100 according to one embodiment of the present invention and a perspective view of the carbon nanotube composite material 100.

FIG. 1A is a schematic diagram of a carbon nanotube composite material 100 according to one embodiment of the present invention and a view of one part cut from the carbon nanotube composite material 100 to expose the interior. FIG. 1B is a perspective view of the carbon nanotube composite material 100. The carbon nanotube composite material 100 related to the present embodiment is formed by dispersing CNT10 and carbon fibers 50 in a matrix 30. CNT group 15 consisting of a plurality of CNT10 is present between adjacent carbon fibers 50.

Furthermore, it is preferable that the structure of the carbon nanotube composite material 100 of the present invention be evaluated by observing a fracture cross section created by the following procedure with a scanning electron microscope (SEM). The SEM image shows a carbon nanotube composite material (sample) cut into a plate with a length of 30 mm, width of 5 mm and thickness of 0.3 mm dipped for 20 seconds in liquid nitrogen while being held by tweezers, removed and then immediately about 10 mm of a part in length is fixed in a vice so that one end of the sample is sandwiched in the thickness direction. The fixed end of the sample is held by pliers and broken by bending in the thickness direction. This frozen fracture cross section is observed by an SEM. Furthermore, the sample size, observation method and magnification may be appropriately selected so that it is possible to observe the CNT and carbon fibers in the carbon nanotube composite material 100 and are not limited thereto.

[CNT Group]

Figure 2:
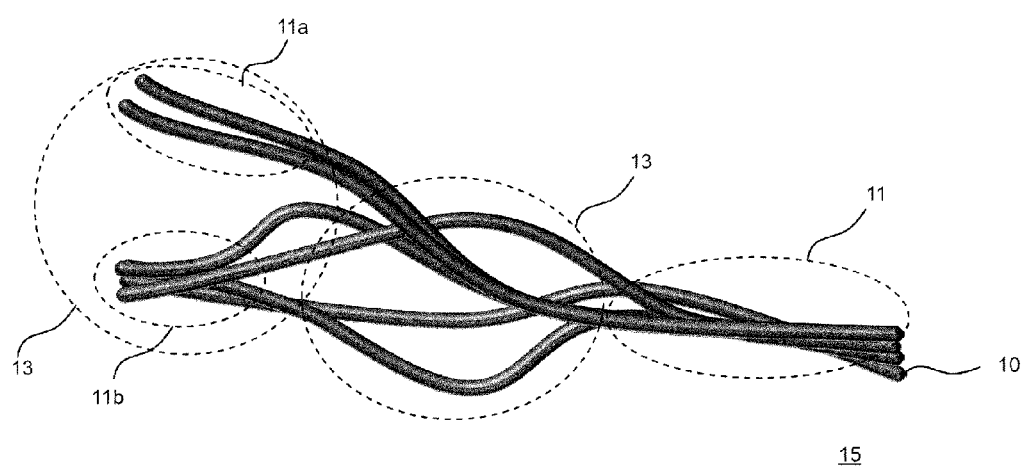
FIG. 2 is a schematic view of a CNT group 15 related to one embodiment of the present invention.

FIG. 2 is a schematic view of the CNT group 15 related to one embodiment of the present invention. The CNT group 15 is characterized in that it is arranged with a network structure (mesh structure, mesh body) in which a plurality of CNTs 10 (or a CNT bundle) and a CNT (or CNT bundle) 10 intertwine and discreetly aggregate. Here, in the CNT group with a plurality of "aggregated" CNTs, CNTs "discreetly aggregate" means that some CNTs locally aggregate or separate, that is they have a "discrete" state. (In FIG. 2, the CNT group 15 in which a plurality of CNT10 is aggregated is shown having an aggregate part 11 and a discrete part 13. In addition, in FIG. 2, the aggregate part 11a and aggregate part 11b are discrete from each other). Within a carbon nanotube composite material, a CNT group 15 includes a three dimensional network structure. A network structure formed from the CNT group 15 is a network of CNTs which run throughout up to small parts across a wide area to form a network in which carbon fibers 50 and CNT groups 15 are in contact with each other.

The carbon nanotube composite material 100 comprises mutually entangled CNTs which forms a nonwoven cloth shape (film shape) and it is preferred that CNT groups 15 form a layer shape by extending in an approximately perpendicular direction with respect to the thickness direction of the carbon nanotube composite 100. The carbon nanotube composite material 100 preferably comprises carbon fibers 50 arranged in a layer shape between the CNT layers and/or pass through a CNT group 15. In addition, the carbon fibers 50 are preferred to be arranged intersecting a direction (approximately perpendicular direction) with respect to the thickness direction.

The carbon nanotube composite material 100 comprising CNT groups 15 and carbon fibers 50 provides better contact between the carbon fibers 50 by the CNT group 15 entering between the carbon fibers and preferably between adjacent carbon fibers 50. In addition, like a hammock the mesh structure of a CNT group 15 supports the carbon fibers with a certain weight compared to a CNT group, sedimentation of the carbon fibers 50 is prevented and thus the carbon fibers 50 are uniformly dispersed in the carbon nanotube composite material 100 and it is possible to obtain a carbon nanotube composite material 100 having excellent thermal properties.

It is preferred that the carbon nanotube composite 100 comprises the CNT group 15 which wraps around the carbon fibers 50, and/or are in contact, and/or is at least partially covered. This type of CNT group 15 provides better thermal contact between a CNT group and carbon fibers and is suitable for achieving a carbon nanotube composite material having a high thermal conductivity.

It is preferred that the carbon nanotube composite material 100 comprises CNT groups 15 which enter between the carbon fibers and connect and/or link and/or cross-link first carbon fibers 50 and second carbon fibers 50 and/or enter between the carbon fibers and are arranged by being mutually entangled. This type of CNT group provides better contact between carbon fibers and is suitable for achieving a carbon nanotube composite material having a high thermal conductivity.

It is preferred that the carbon nanotube composite 100 includes a CNT group 15 having a size of 10 μm or more, preferably 15 μm or more and more preferably 20 μm or more. Here, the CNT group 15 is a network of CNT that run three-dimensionally throughout up to small parts across a wide area wherein pairs of CNT groups 15 are in contact with each other. Therefore, it is difficult to measure the size of each CNT group 15. Thus in the present invention, in order to define the size of a CNT group 15, a two-dimensional image observed using an optical micrograph of a fracture cross section of a carbon nanotube composite material is used. The size of a CNT group 15 is defined as the maximum value of the distance of a mesh structure of a CNT group 15 present at the farthest position with respect to a certain point with respect to all points which form the network structure of a CNT group 15 observed using a two-dimensional image.

A CNT group 15 having such a size easily crosslinks between carbon fibers 50, provides better thermal contact between the carbon fibers 50 and is suitable for achieving a carbon nanotube composite material having a high thermal conductivity.

Figure 3:
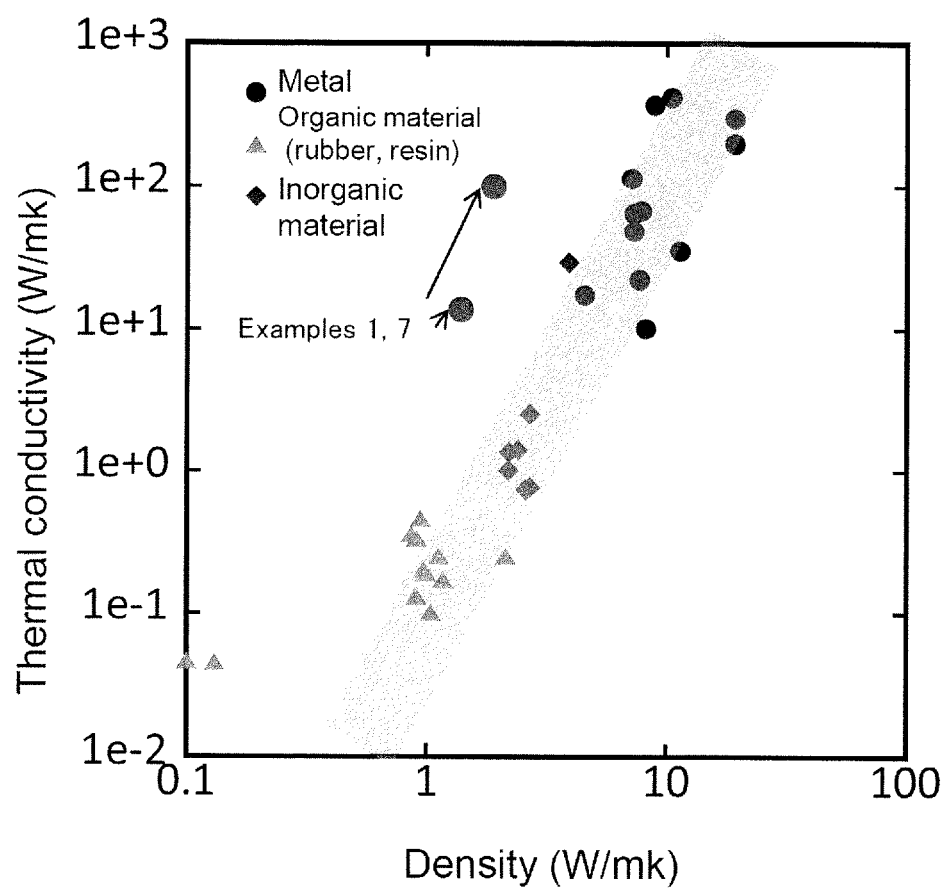
FIG. 3 is a diagram showing the relationship between (weight) density and thermal conductivity of a carbon nanotube composite material related to one embodiment of the present invention and other materials.

The carbon nanotube composite 100 has a weight density of 1.0 g/cm$^3$ or more and 3.0 g/cm$^3$ or less, preferably 2.5 g/cm$^3$ or less and more preferably 2.1 g/cm$^3$ or less. Since the carbon nanotube composite 100 is formed from light carbon fibers, CNT, and a resin or rubber, the material has a low density and is light compared to metal. In FIG. 3, the density (weight) and thermal conductivity of the carbon nanotube composite 100 related to the present invention are compared with other materials such as metal and an inorganic material. It is clear that the carbon nanotube composite material 100 related to the present invention has properties such as light weight and a high heat transfer compared with other materials.

[Properties of Carbon Nanotube Composite Materials]

As shown in FIG. 1, in the carbon nanotube composite material 100 related to the present embodiment, carbon fibers 50 are arranged mainly in a planar direction of the carbon nanotube composite material 100, and extend in the plane of the carbon nanotube composite 100. The carbon nanotube composite material 100 related to the present embodiment has carbon fibers 50 orientated and dispersed in the length direction (first direction) of the carbon nanotube composite material 100 and CNTs10 are dispersed between layers of the carbon fibers 50.

The carbon nanotube composite material obtained by uniformly dispersing carbon fibers 50 having this type of orientation has an in-plane direction in which thermal conductivity becomes 10 W/mK or more and a thickness direction in which thermal conductivity becomes 0.5 W/mK or more. In addition, in the top surface (first surface facing the thickness direction of the carbon nanotube composite 100) of the carbon nanotube composite 100 and the rear surface (second surface facing the thickness direction of the carbon nanotube composite 100) have a top surface sheet resistance and rear surface sheet resistance ratio of 0.2 or more and 5 or less.

In addition, the hardness (Martens hardness) of the carbon nanotube composite material 100 is 0.01 N/mm$^2$ or more and 10 N/mm$^2$ or less. The carbon nanotube composite material 100 having hardness in this range is flexible and has a low thermal resistance at the contact point. Therefore, when the carbon nanotube composite 100 is used as a heat conductor, it is possible to improve contact with heating components and high heat dissipation properties can be exhibited.

It is preferred that the carbon nanotube composite material 100 has a sheet-like form, film-like form and pellet form by formation. The carbon nanotube composite 100 which is formed in such a form can be suitably used as a heat conductor.

The carbon fibers 50 and the CNT groups 15 forming the carbon nanotube composite 100 are dispersed in a matrix 30. The CNT groups 15 enter between the carbon fibers 50 and a network is formed by linking the carbon fibers 50 and the CNT groups 15. In the carbon nanotube composite 100 according to the present application, by removing the matrix 30 by heating, a network structure composed from the carbon fibers 50 and the CNT groups 15 is evaluated.

In a network structure extracted from the carbon nanotube composite 100, the carbon fibers 50 have a maximum distribution range of a differential pore volume of 1 μm or more and 100 μm or less in a range of 4 nm or more and 1000 μm or less of a pore diameter measured by a mercury intrusion porosimeter.

In a network structure extracted from the carbon nanotube composite 100, the carbon nanotube group has a maximum distribution range of a differential pore volume of 0.01 μm or more and 10 μm or less in a range of 4 nm or more and 1000 μm or less of a pore diameter measured by the mercury intrusion porosimeter.

In a network structure extracted from the carbon nanotube composite 100, a total specific surface area of the carbon nanotube group and the carbon fibers 50 measured by using the Brunauer, Emmett and Teller method is 10 m$^2$/g or more and 500 m$^2$/g or less. The specific surface area is measured using the adsorption and desorption isotherms of liquid nitrogen at 77K, measured by the method of Brunauer, Emmett, Teller from this adsorption-desorption isotherm.

[Carbon Fiber]

The carbon fiber in the present invention is, for example, a carbon fiber or graphite fiber made from PAN (Polyacrylonitrile) system or from pitch (PITCH) system, a metal covered carbon fiber formed by covering them with at least one layer of a metal such as nickel, ytterbium, gold, silver or copper using a method such as plating, (electrolytic, electroless), CVD method, PVD method, ion plating method or a vapor deposition method, or a carbon fiber or graphite fiber made by blending two or more of these. In the case of combining two or more, it is possible to combine carbon fibers with fibers other than carbon fibers such as glass fibers or aramid fibers. A pitch-based carbon fiber with excellent thermal conductivity is preferred as the carbon fiber.

In the carbon nanotube composite material 100, thermal conductivity of the carbon fiber 50 is preferably 300 W/mK or more, more preferably 400 W/mK or more and still more preferably 500 W/mK or more. By uniformly dispersing carbon fibers having such thermal conductivity in the matrix 30, it is possible to provide high thermal conductivity to the carbon nanotube composite material 100.

In addition, in the carbon nanotube composite material 100, thermal conductivity of the carbon fiber 50 to be used is preferred to be the same or higher than the thermal conductivity of the CNT10. Although the CNT itself has excellent thermal conductivity, by using carbon fibers with a higher thermal conductivity than the CNT, it is possible to provide high thermal conductivity to the carbon nanotube composite material 100.

In the carbon nanotube composite material 100, the average diameter of the carbon fiber 50 is preferably 1 µm or more and 50 µm or less, more preferably 2 µm or more and 40 µm or less, and still more preferably 3 µm or more and 30 µm or less. Carbon fibers having such an average diameter can have increased heat transmitted per carbon fiber and high thermal conductivity can be provided.

In addition, the average diameter of the carbon fibers 50 is preferred to be 1000 times or more and 10,000 times or less than the average diameter of CNT10. By having a ratio of such an average diameter, it becomes easier for CNT10 to enter between the carbon fibers 50 and good thermal contact between the carbon fibers 50 can be provided.

In the carbon nanotube composite material 100, the average length of the carbon fibers 50 is preferred to be 100 µm or more, more preferably 150 µm or more, and still more preferably 200 µm or more. By uniformly dispersing carbon fiber 50 having such a length in the matrix 30, it is possible to reduce contact points between pairs of carbon fibers and provide a high thermal conductivity.

In the carbon nanotube composite material 100, the addition amount of the carbon fiber 50 is not particularly limited, however, considering a balance between thermal conductivity, mechanical properties and formation properties of the carbon nanotube composite material 100 to be obtained, a range of 10 wt % or more and 60 wt % or less is preferred and a range of 15 wt % or more and 50 wt % or less is more preferable with respect to 100 wt % of the carbon nanotube composite material 100.

[Properties of Carbon Nanotubes]

Single-walled carbon nanotubes (SWNT) wrapped in one layer on one surface of a hexagonal carbon network plane of graphite, double-walled carbon nanotubes (DWNT) rolled in two layers, or multi-walled carbon nanotubes (MWNT) wrapped in three or more layers may be appropriately used for the CNT10 used in the carbon nanotube composite material 100. In addition, it is possible to use a carbon material having a partial carbon nanotube structure. Furthermore, these can take any form such as a needle shape, coil shape, tube, cup-shape and two or more kinds of these can be blended. Furthermore, these may be referred to as graphite fibril nanotubes in addition to carbon nanotubes. In addition, although the CNT10 can suitably use a CNT obtained by a manufacturing method of growing crystals in a gas phase (vapor phase epitaxy), graphitization processing at a temperature of about 2300° C. to 3200° C. together with a graphitization catalyst such as boron, boron carbide, beryllium, aluminum, or silicon, etc may also be performed.

In the carbon nanotube composite material 100, single-walled CNTs are preferred for the CNT10. A single-walled CNT can easily enter between the carbon fibers 50 and good thermal contact between the carbon fibers 50 can be provided.

Verification that CNT10 is a single wall is performed using a transmission electron microscope (TEM) at a magnification of 400,000, the number of layers is evaluated with respect to 100 CNTs arbitrarily extracted from the field of view of which 10% of the viewing area in a field of view of 75 nm square is a CNT aggregate and the number of single walled CNTs is confirmed. In the case where 100 CNTs cannot be measured in one field of view, measurement is performed from a plurality of fields of view until the number reaches 100. At this time, one CNT is recorded as one CNT if one part of a CNT is visible in the field of view and both ends of a CNT do not necessarily have to be visible. In addition, although it is also possible that two recognized CNTs in a field of view may become one CNT linked together outside of the field of view, in this case two CNTs are recorded.

A cylindrical graphite structure which is a characteristic of a CNT can be examined by a high resolution transmission electron microscope. Although it is preferred that a layer of graphite be as clearly visible in a straight line as possible in a transmission electron microscope, the graphite layer does not have to be straight. Although a non-straight graphite layer is sometimes defined as a carbon nanofiber, these carbon nanofibers also include CNTs in the present invention.

Although the CNT10 used in the carbon nanotube composite material 100 can be generally manufactured using a laser ablation method, arc discharge method, a thermal CVD method, a plasma CVD method, or combustion method, the CNT may be manufactured using any method. For example the CNT10 used in the carbon nanotube composite material 100 may be obtained using the manufacturing method described in Patent Application No. 2010-544871 (U.S. Pat. No. 4,803,687).

The characteristics of the CNT10 used for the carbon nanotube composite material 100 of the present invention are that it is possible to evaluate the CNT 10 using Buckey paper by extracting only CNT10 from the carbon nanotube composite material 100, for example. Extraction can be performed using an appropriate known means such as dissolving the matrix 30 using a solvent. The length of the CNT10 used in the carbon nanotube composite material 100 of the present invention is preferably 0.1 µm or more, more preferably 0.5 µm or more, and 1 µm or more is preferred. This type of CNT10 can easily enter between the carbon fibers 50 and good thermal contact can be provided between the carbon fibers 50.

The average diameter of CNT10 used in the carbon nanotube composite material 100 of the present invention is in the range of 0.7 nm or more and 50 nm or less, and preferably in the range of 1 nm or more and 10 nm or less. If the average diameter is too small, cohesion is too strong and the CNT10 does not disperse. If the average diameter is too large, the contact resistance between the CNTs increases and therefore formation of a thermal contact with a high thermal conductivity is inhibited. Furthermore, the average diameter of the CNT10 used in the carbon nanotube composite 100 of the present invention is calculated from the exterior diameter of each individual CNT from a transmission electron microscope (hereinafter referred to as TEM) image of a carbon nanotube aligned aggregate before being dispersed in a matrix, that is, from a histogram by measuring the diameter and creating a histogram.

It is preferred that the carbon purity measured by an analysis using fluorescent X-rays of the CNT10 used in the carbon nanotube composite material 100 of the present invention is 90 wt % or more, more preferably 95 wt % or more, and more preferably 98 wt % or more. Since the amount of impurities such as metal catalyst is small, it is possible to provide a CNT of such high purity with good moldability. Furthermore, carbon purity indicates what percentage of the weight of the CNT is composed of carbon, and the carbon purity of the CNT10 used for the carbon nanotube composite material 100 of the present invention is determined from an elemental analysis using fluorescent X-rays.

The CNT10 used for the carbon nanotube composite material 100 of the present invention is preferred to have a G/D ratio of 3 or more when the maximum peak intensity in the range of 1560 $cm^{-1}$ or more and 1600 $cm^{-1}$ or less is given as G and the maximum peak intensity in the range of 1310 $cm^{-1}$ or more and 1350 $cm^{-1}$ or less is given as D in a spectrum obtained by measuring the resonance Raman scattering measurement method. A CNT10 arranged with such a high G/D ratio as above may have improved thermal conductivity.

In the carbon nanotube composite material 100 of the present invention, it is preferred that CNTs having these characteristics are included in a range of 0.01 wt % or more and 30 wt % or less. With a contained amount of CNTs smaller than this, it is difficult to uniformly disperse the carbon fibers 50 in the carbon nanotube composite material 100. In addition, since CNTs in a contained amount larger than this suppress the characteristics of the matrix 30, CNTs in an amount greater than this is not preferable.

[Matrix]

Although there is no particular limitation to the matrix 30 used in the present invention, a material with a thermal conductivity less than 10 W/mK, more preferably 5 W/mK, and particularly preferably 2 W/mK or less is preferred in order to obtain the effects of the present invention. In particular, the use of a resin is preferable. The resin used for the matrix 30 is preferred to be at least one of a silicone-based resin, modified silicone-based resins, acrylic-based resins, chloroprene-based resins, polysulfide-based resins, polyurethane-based resins, polyisobutyl-based based resin, and a fluorosilicone-based resin. It is possible to use either a thermoplastic resin or thermosetting resin.

As the thermosetting resin, for example, it is possible to use unsaturated polyester, vinyl ester, epoxy, phenol (resol type), urea-melamine, polyimide or the like, copolymers thereof, a modified product, and a resin blended from two or more of these resins. In addition, in order to improve impact resistance, a resin may be used obtained by adding an elastomer or rubber component to the thermosetting resins described above.

As examples of the thermoplastic resin, for example, polyesters such as polyethylene terephthalate (PET), polybutylene terephthalate (PBT), polytrimethylene terephthalate (PTT), polyethylene naphthalate (PEN), liquid crystal polyesters, etc., polyolefins such as polyethylene (PE), polypropylene (PP), polybutylene, etc., and other styrene-based resin, polyoxymethylene (POM), polyamide (PA), polycarbonate (PC), polymethylene methacrylate (PMMA), polyvinyl chloride (PVC), polyphenylene sulfide (PPS), polyphenylene ether (PPE), modified PPE, polyimide (PI), polyamide-imide (PAI), polyetherimide (PEI), polysulfone (PSU), polyether sulfone, polyketone (PK), polyether ketone (PEK), even a fluorine-based resin polyether ether ketone (PEEK), polyether ketone ketone (PEKK), polyarylate (PAR), polyether nitrile (PEN), phenolic resins, phenoxy resins, and fluorocarbon-based resin such as polytetrafluoroethylene can be exemplified.

The elastomer used in the carbon nanotube composite material 100 of the present invention may be any of a rubber elastomer or thermoplastic elastomer. Examples of elastomers may contain one or more selected from an elastomer such as natural rubber (NR), epoxidized natural rubber (ENR), styrene-butadiene rubber (SBR), nitrile rubber (NBR), chloroprene rubber (CR), ethylene-propylene rubber (EPR, EPDM), butyl rubber (IIR), chlorobutyl rubber (CIIR), acrylic rubber (ACM), silicone rubber (Q), fluorocarbon rubber (FKM), butadiene rubber (BR), epoxidized butadiene rubber (EBR), epichlorohydrin rubber (CO, CEO), urethane rubber (U), polysulfide rubber (T), a thermoplastic elastomer such as olefin-based elastomer-based (TPO), polyvinyl chloride-based (TPVC), polyester-based (TPEE), polyurethane-based (TPU), polyamide-based (TPEA), or styrene-based (SBS). It is also possible to use mixtures. In particular, a highly polar elastomer which easily produces free radicals when mixing the elastomer, for example, natural rubber (NR), nitrile rubber (NBR), is preferable. In addition, the elastomer may be a mixture of these, a copolymer, modified body, and two or more kinds of blends.

As the matrix used in the carbon nanotube composite material 100 of the present invention, in particular a fluorocarbon resin or fluorocarbon rubber is preferred. This is because it is possible to favorably disperse CNTs with a high affinity between fluorocarbon resin and carbon nanotubes.

As the fluorine resin, any of polytetrafluoroethylene, polychlorotrifluoroethylene, polyvinylidene fluoride, polyvinyl fluoride, perfluoroalkoxy fluorocarbon resin, tetrafluoroethylene-hexafluoropropylene copolymer, ethylene-tetrafluoroethylene copolymer, ethylene-chlorotrifluoroethylene copolymer or a mixture of these can be suitably used.

[Method]

A method for manufacturing the carbon nanotube composite material 100 related to the present embodiment described above is explained below. As described above, it is possible to use a known CNT in the carbon nanotube composite material 100.

[Dispersion of Carbon Nanotubes]

Figure 4:
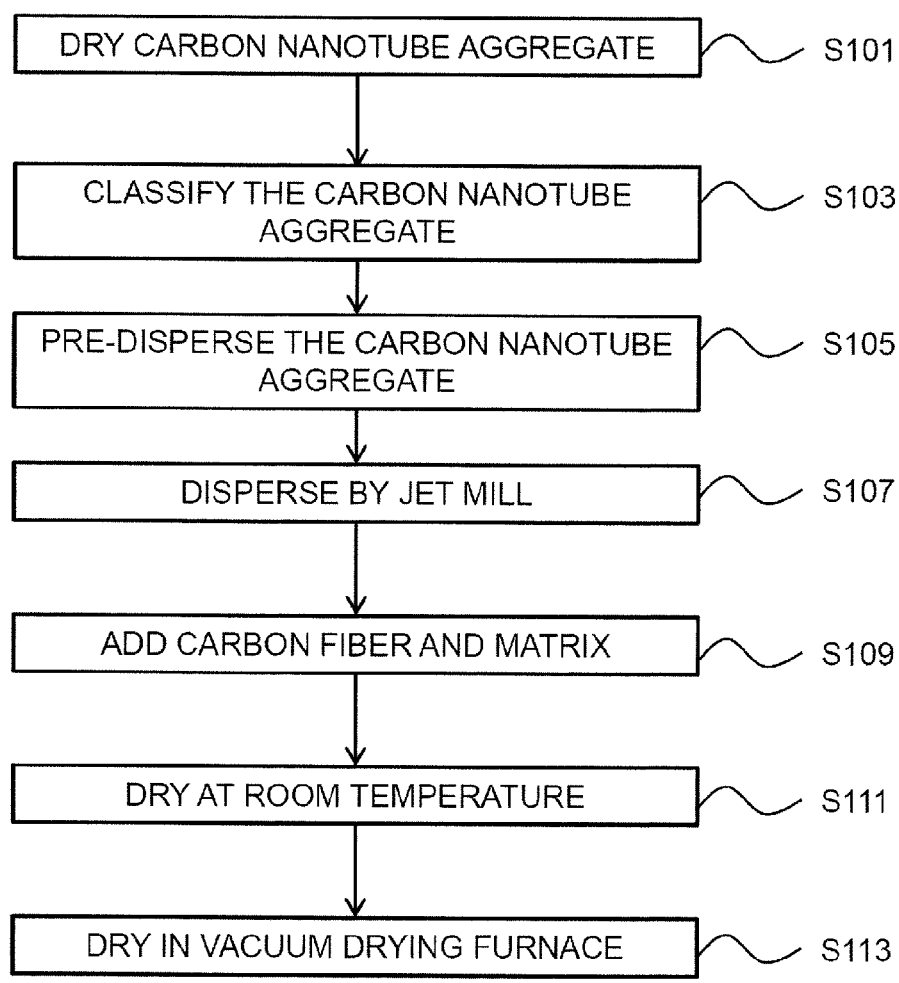
FIG. 4 is a flowchart showing a manufacturing process of the carbon nanotube composite material related to one embodiment of the present invention.

Since CNTs are supplied as a carbon nanotube aggregate (hereinafter, referred to as CNT aggregate) it is necessary to first disperse in a solvent and mix in a matrix with carbon fibers. A manufacturing method of a carbon nanotube composite material using a CNT composite material is described with reference to FIG. 4. First, a drying process of a CNT aggregate that is supplied is performed (S101). Dispersibility is increased by performing the drying step, which is favorable for manufacturing the carbon nanotube composite material related to the present invention. The carbon nanotubes for a CNT aggregate used in the carbon nanotube composite material of the present invention are stored in an atmosphere and easily adsorb moisture in the atmosphere between the carbon nanotubes during transport. Because pairs of carbon nanotubes stick together due to water surface tension in a state where the water component is adsorbed, it is very difficult for the carbon nanotubes to loosen and good dispersion properties are obtained in the matrix. Thus, by performing a drying process of the carbon nanotubes before a dispersion process, the water component included in the carbon nanotubes is removed and it is possible to increase the dispersion properties to a dispersion medium. It is possible to use heat drying or vacuum drying for example in the drying process and heat vacuum drying is preferably used.

Performing classification by a classification process of the peeled CNT aggregate is preferred (S103). The classification process obtains a uniform sized CNT aggregate by setting the size of the CNT aggregate within a certain range. The CNT aggregate also includes synthesized components with a large clump shaped size. Since the dispersion properties of the CNT aggregate including these large sized clumps is different, the formation of a stable dispersion liquid is obstructed. Thus, only a CNT aggregate with the large sized clumps removed by passing the aggregate through a net, filter or mesh for etc. used in subsequent processes is suitable for obtaining a stable carbon nanotube dispersion liquid.

It is preferred to perform a pre-dispersion process on the classified CNT aggregate prior to the next dispersion step (S105). The pre-dispersion step is a step of dispersing by stirring the CNT aggregate in a solvent. The carbon nanotubes used in the carbon nanotube composite material of the present invention, as described herein, are preferred to be dispersed using a dispersion method using a jet mill, however, it is possible to prevent the carbon nanotubes from clogging the jet mill by carrying out the pre-dispersion process, and, it is possible to increase the dispersibility of the carbon nanotubes. Use of a stirrer is preferred in the pre-dispersion step.

A dispersion process in the dispersion liquid of the CNT aggregate subjected to a pre-dispersing process is performed (S107). A method of dispersing carbon nanotubes by shear stress is preferable and a jet mill is preferably used. In particular a wet type jet mill can be favorably used. A wet type jet mill squeezes mixed products in a solvent from a nozzle arranged in a sealed state within a pressure resistant container as a high speed flow. The carbon nanotubes are dispersed by collision of opposing flows, collision against container walls, turbulence produced by high speed flows and by a shear flow within the pressure resistant container. In the case where a nano-jet pal (JN10, JN100, JN1000) manufactured by JOKOH ltd is used as the wet type jet mill, a processing pressure in the dispersion process is preferred to be a value within a range of 10 MPa or more and 150 MPa or less. In addition, a jet mill (HJP-17004) manufactured by Sugino Machine Ltd may also be used.

The carbon nanotube dispersion dispersed in this way maintains excellent electrical properties, thermal conduction and mechanical properties of the carbon nanotubes, has a high level of dispersion properties and a stable dispersion liquid can be provided.

Next, a matrix solution obtained by dissolving a matrix in a solvent, and carbon fibers are prepared, added to the carbon nanotube dispersion liquid, and stirred sufficiently to disperse the carbon nanotubes and carbon fibers in the matrix (S109). As described above, in the carbon nanotube composite material of the present invention, in the case where the mass of the carbon nanotube composite as a whole is 100% by mass, the carbon nanotube dispersion liquid is mixed with the matrix solution so that the weight becomes 0.01 wt % or more and 30 wt % or less. In addition, carbon fibers in a range of 10 wt % or more and 60 wt % or less and more preferably 15 wt % or more and 50 wt % or less with respect to 100 wt % of the carbon nanotube composite material is added.

By pouring the sufficiently mixed solution into a petri dish and drying at room temperature, the carbon nanotube composite material hardens (S111). At this time, it is preferred that the mixed solution is dried while stirring. When the solution is dried without stirring, carbon fibers with a large density separate.

The hardened carbon nanotube composite material was inserted into a vacuum drying furnace and the solution was removed (S113). Here, the drying temperature used makes it possible to sufficiently remove the solvent from the carbon nanotube composite material so that the matrix does not deteriorate. Therefore, although it is possible to change the temperature according to the matrix used in the carbon nanotube composite material, at 80° C. for example, the solvent is sufficiently removed and the matrix does not deteriorate.

[Solvent]

As the solvent used in dissolving the dispersion medium and the matrix of the carbon nanotubes used in the carbon nanotube composite material of the present invention, it is possible to use an organic solvent capable of dissolving the matrix and appropriately select the solvent according to the matrix to be used. For example, it is possible to use toluene, xylene, acetone, carbon tetrachloride and the like. In particular, as the solvent used in the carbon nanotube composite material of the present invention, many rubbers including fluorocarbon rubber and silicone rubber are soluble, and methyl isobutyl ketone (hereinafter referred to as MIBK) which is a good solvent for carbon nanotubes is preferred.

A dispersant can be added to the carbon nanotube dispersion liquid. The dispersant serves to improve the dispersion power of the carbon nanotubes and dispersion stabilizing ability.

In this way, it is possible to produce the carbon nanotube composite material of the present invention which can exhibit a high conductivity with a low additive amount of carbon nanotubes.

As explained above, by distributing the carbon nanotubes and carbon fibers according to the present invention in a matrix, a carbon nanotube composite material having excellent uniformity, a high thermal conductivity, and a thermal conductor can be realized.

[Thermal Conductor]

It is possible to realize a thermal conductor having excellent uniformity and a high thermal conductivity by forming the carbon nanotube composite material described above. The thermal conductor related to the present invention can be used as an excellent heat dissipation component in various fields not only in small electronic devices or LED's by using a known processing method.

EXAMPLES

Example 1

[Characteristics of the CNT Used in Example 1]

As a typical value the CNT used in Example 1 has a length of 100 μm, an average diameter of 3.0 nm and thermal conductivity of 80 W/mK.

[Raman Spectrum Evaluation of CNT Aggregate]

A Raman spectrum of the CNT aggregate used in Example 1 was measured. A sharp G-band peak was observed in the vicinity of 1590 $cm^{-1}$, and from this it can be seen that a graphite crystal structure is present in the CNT constituting the CNT aggregate of the present invention.

In addition, since a D-band peak derived from structural defects is observed in the vicinity of 1340 $cm^{-1}$, this shows that significant defects are included in the CNT and since a RBM mode due to a plurality of single-walled CNT's was observed on the low wavelength side (100 to 300 cm$^{-1}$), it can be seen that this graphite layer is a single-walled CNT. The G/D ratio was 8.6.

[Purity of CNT Aggregate]

The carbon purity of CNT aggregate was calculated from the elemental analysis results using fluorescent X-rays. As a result of an elemental analysis by fluorescence X-rays of the CNT aggregate, the weight percent of carbon was 99.98%, the weight percent of iron was 0.013%, and other elements were not measured. From this result, the carbon purity was measured as 99.98%.

[Dispersion of CNT]

The supplied CNT aggregate was placed on one mesh with 0.8 mm mesh openings, the aggregate was sucked with a vacuum cleaner via the mesh, and what passed through was collected and large size bulk shaped CNT aggregates were removed from the CNT aggregate and classified (classification process).

The CNT aggregate was measured for water content using a Karl Fischer reaction method (coulometric titration method trace moisture measurement device CA-200 manufactured by Mitsubishi Chemical Analytech). After drying the CNT aggregate under predetermined conditions (under a vacuum, held for 1 hour at 200° C.), the CNT was put into a glove box filled with a dry nitrogen gas flow, the vacuum was removed and about 30 mg of the CNT aggregate was extracted and transferred to the glass boat of a moisture meter. The glass boat was moved to a vaporizer where it was heated for 2 minutes at 150° C., the vaporized water component during this time was carried by the nitrogen gas and was reacted with iodine using an adjacent Karl Fischer reaction. The amount of water was detected by the iodine consumed at that time and the amount of electricity required to generate an equal amount of iodine. By this method, the CNT aggregate before drying contained a water content of 0.8 wt %. The water content of the CNT aggregate after drying was reduced to 0.3 wt %.

100 mg of the classified CNT aggregate was accurately weighed, inserted into a 100 ml flask (3 ports: for vacuum, temperature adjustment) held for 24 hours after reaching 200° C. under a vacuum and dried. After drying was completed, the aggregate was heated and left in a vacuum processing state, 20 ml of a dispersion medium MIBK (methyl isobutyl ketone) (manufactured by Sigma-Aldrich Japan Co., Ltd.) was injected and the CNT aggregate was prevented from exposure to air (drying process).

Furthermore, MIBK (manufactured by Sigma Aldrich Japan Co., Ltd.) was added so that the total amount was 300 ml. A stirrer was put into the beaker then sealed with aluminum foil and stirred at 600 RPM with the stirrer at room temperature for 24 hours so that the MIBK did not vaporize.

A wet type jet mill ((HJP-17004) manufactured by Sugino Machine Ltd) was used in the dispersion step, after passing through a flow path of 0.13 mm under a pressure of 100 MPa×2 the CNT aggregate was dispersed in MIBK and a carbon nanotube dispersion liquid with a concentration of 0.033 wt % was obtained.

The dispersion liquid was stirred at room temperature for 24 hours by a stirrer. At this time, a solution was heated to 70° C. and the MIBK was vaporized to about 150 ml. The weight concentration of carbon nanotubes at this time was about 0.075 wt % (dispersion step). In this way, the carbon nanotube dispersion liquid related to the present invention was obtained.

In the present example, pitch-based carbon fiber (DIA-LEAD (registered trademark) K223HM manufactured by Mitsubishi Plastics Co., Ltd.) was used as a carbon fiber. The average diameter of the carbon fiber was 10 μm, average length was 213 μm and thermal conductivity A was 627 W/mK.

In the present example, fluorocarbon rubber (Daiel-G912 manufactured by Daikin Industries, Ltd.,) was used as a matrix. In the case where the mass of the entire carbon nanotube composite material is given as 100%, 600 ml of the carbon nanotube dispersion liquid was added so that the CNT content became 4.8% and 20 g of carbon fibers were added so that the carbon fiber content became 19% to 50 ml of the fluorocarbon rubber solution, and concentrated using a stirrer at about 300 rpm for 16 hours at room temperature until the total volume became 50 ml.

The thoroughly mixed solution was poured into a petri dish or the like, dried at room temperature for 12 hours while stirring and the carbon nanotube composite material was solidified.

The solidified carbon nanotube composite material was put in a vacuum drying oven at 80° C., dried for 24 hours and the solvent was removed. In this way, the carbon nanotube composite 200 of Example 1 was obtained (the shape of the sample is a circular sheet-like shape with a diameter of 77 mm and thickness of about 300 μm).

Example 2

As Example 2, using the method similar to Example 1, in the case where the entire mass of the carbon nanotube composite material is given as 100%, carbon nanotube dispersion liquid and carbon fiber were respectively added to the fluorocarbon rubber solution so that the carbon nanotube content became 4.8% and the carbon fiber content became 28.6% and the carbon nanotube composite material 210 was prepared.

Example 3

In Example 3, silicone rubber (TSE3282-G manufactured by Momentive Performance Materials Japan LLC) was used as the matrix. Using a manufacturing method similar to Example 1, in the case where the entire mass of the carbon nanotube composite material is given as 100%, carbon nanotube dispersion liquid and carbon fiber were respectively added to the silicone rubber solution so that the carbon nanotube content became 4.8% and the carbon fiber content became 19% and the carbon nanotube composite material 220 was prepared.

Example 4

In Example 4, acrylonitrile-butadiene-styrene copolymer synthetic resin (ABS resin) (manufactured by Toray Industries, Inc.) was used as a matrix, and using a manufacturing method similar to Example 1, in the case where the entire mass of the carbon nanotube composite material is given as 100%, carbon nanotube dispersion liquid and carbon fiber were respectively added to the ABS resin solution so that the carbon nanotube content became 4.8% and the carbon fiber content became 19% and the carbon nanotube composite material 230 was prepared.

Example 5

As Example 5, using the method similar to Example 1, in the case where the entire mass of the carbon nanotube composite material is given as 100%, carbon nanotube dispersion liquid and carbon fiber were respectively added to the fluorocarbon rubber solution so that the carbon nanotube content became 6.7% and the carbon fiber content became 19.0% and the carbon nanotube composite material 240 was prepared.

Example 6

As Example 6, using the method similar to Example 1, in the case where the entire mass of the carbon nanotube composite material is given as 100%, carbon nanotube dispersion liquid and carbon fiber were respectively added to the fluorocarbon rubber solution so that the carbon nanotube content became 9.5% and the carbon fiber content became 19.0% and the carbon nanotube composite material 250 was prepared.

Example 7

As Example 7, an equivalent amount of 1% by mass of nitric acid was added to a CNT/CF solution and acid treatment was performed for 5 minutes. Following this, after washing the acid with water and ethanol, using a method similar to Example 1, a carbon nanotube composite material was produced. However, in the case where the entire mass of the carbon nanotube composite material is given as 100%, carbon nanotube dispersion liquid and carbon fiber were respectively added to the fluorocarbon rubber solution so that the carbon nanotube content became 4.8% and the carbon fiber content became 19.0% and the carbon nanotube composite material 260 was prepared.

Example 8

In Example 8, hydrin rubber (manufactured by ZEON Corporation) was used as a matrix, and a carbon nanotube composite material was produced using a method similar to Example 7. However, in the case where the entire mass of the carbon nanotube composite material is given as 100%, carbon nanotube dispersion liquid and carbon fiber were respectively added to the hydrin rubber solution so that the carbon nanotube content became 4.8% and the carbon fiber content became 19.0% and the carbon nanotube composite material 270 was prepared.

Example 9

In Example 8, acrylic rubber (manufactured by ZEON Corporation) was used as a matrix, and a carbon nanotube composite material was produced using a method similar to Example 7. However, in the case where the entire mass of the carbon nanotube composite material is given as 100%, carbon nanotube dispersion liquid and carbon fiber were respectively added to the acrylic rubber solution so that the carbon nanotube content became 4.8% and the carbon fiber content became 19.0% and the carbon nanotube composite material 280 was prepared.

Comparative Example 1

In Comparative Example 1, a carbon nanotube composite material 900 that does not contain carbon fiber was manufactured. Using the method similar to Example 1, in the case where the entire mass of the carbon nanotube composite material is given as 100%, carbon nanotube dispersion liquid was added to the fluorocarbon rubber solution so that the carbon nanotube content became 5% and the carbon nanotube composite material 900 was prepared.

Comparative Example 2

In Comparative Example 2, a composite material 910 that does not contain CNT was manufactured. In the case where the entire mass of the composite material is given as 100%, carbon fiber was added to the fluorocarbon rubber solution so that the carbon fiber content became 20% and the composite material 910 was prepared using the method similar to Example 1.

Comparative Example 3

In Comparative Example 3, a composite material 930 that does not contain CNT was manufactured. In the case where the entire mass of the composite material is given as 100%, carbon fiber was added to the fluorocarbon rubber solution so that the carbon fiber content became 10% and the composite material 920 was prepared using the method similar to Example 1.

Comparative Example 4

In Comparative Example 4, a composite material 950 that does not contain CNT was manufactured. In the case where the entire mass of the composite material is given as 100%, carbon fiber was added to the fluorocarbon rubber solution so that the carbon fiber content became 30% and the composite material 930 was prepared using the method similar to Example 1.

Comparative Example 5

As Comparative Example 5, multi-walled CNT Nanocyl (NC7000, Nanocyl Company) was used as a CNT, using the method similar to Example 1, in the case where the entire mass of the carbon nanotube composite material is given as 100%, carbon nanotube dispersion liquid and carbon fiber were respectively added to the fluorocarbon rubber solution so that the carbon nanotube content became 4.8% and the carbon fiber content became 28.6% and the carbon nanotube composite material 940 was prepared.

Comparative Example 6

As Comparative Example 6, HiPCO which is a short single-walled CNT (NanoIntegris Co.) was used as a CNT, using the method similar to Example 1, in the case where the entire mass of the carbon nanotube composite material is given as 100%, carbon nanotube dispersion liquid and carbon fiber were respectively added to the fluorocarbon rubber solution so that the carbon nanotube content became 4.8% and the carbon fiber content became 28.6% and the carbon nanotube composite material 950 was prepared.

Comparative Example 7

As Comparative Example 7, AlN (Toyarunaito, Toyo Aluminium Co.) which is a thermally conductive filler was used instead of CNT, using the method similar to Example 1, in the case where the entire mass of the carbon nanotube composite material is given as 100%, AlN dispersion liquid and carbon fiber were respectively added to the fluorocarbon rubber solution so that the AlN content became 4.8% and the carbon fiber content became 28.6% and the AlN composite material 960 was prepared.

Comparative Example 8

As Comparative Example 8, graphene (Graphene Nano Powder, ATR Co. Ltd) which is a thermally conductive filler was used instead of CNT, using a method similar to Example 1, in the case where the entire mass of the carbon nanotube composite material is given as 100%, graphene dispersion liquid and carbon fiber were respectively added to the fluorocarbon rubber solution so that the graphene content became 4.8% and the carbon fiber content became 28.6% and the graphene composite material 970 was prepared.

[Scanning Electron Microscope Image]

Scanning electron microscope (referred to below as SEM) images of a frozen fracture cross section with respect to Example 1, Example 2, Comparative Example 2 and Comparative Example 4 were compared. The SEM image shows a carbon nanotube composite material (sample) cut into a plate shape with a length of 30 mm, width 5 mm and thickness of 0.3 mm dipped for 20 seconds in liquid nitrogen while being held by tweezers, removed and then immediately about 10 mm in length is fixed in a vice so that one end of the sample is sandwiched in the thickness direction. The fixed end of the sample is held by pliers and broken by bending in the thickness direction. This frozen fracture cross section is observed by an SEM.

Figure 5A:
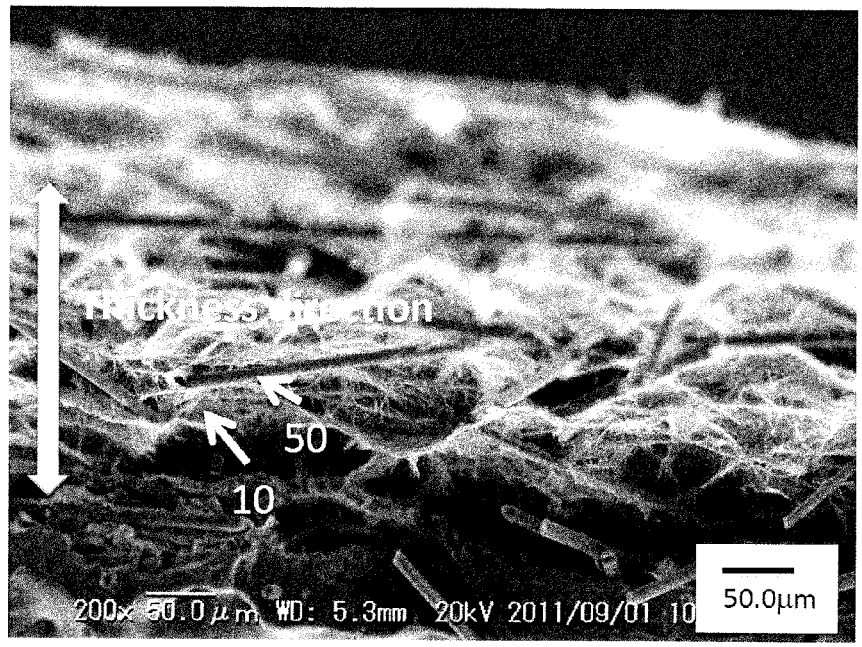
FIG. 5A is a SEM image of a fracture cross section of a carbon nanotube composite material 200 related to one embodiment at 200 times magnification.
Figure 5B:
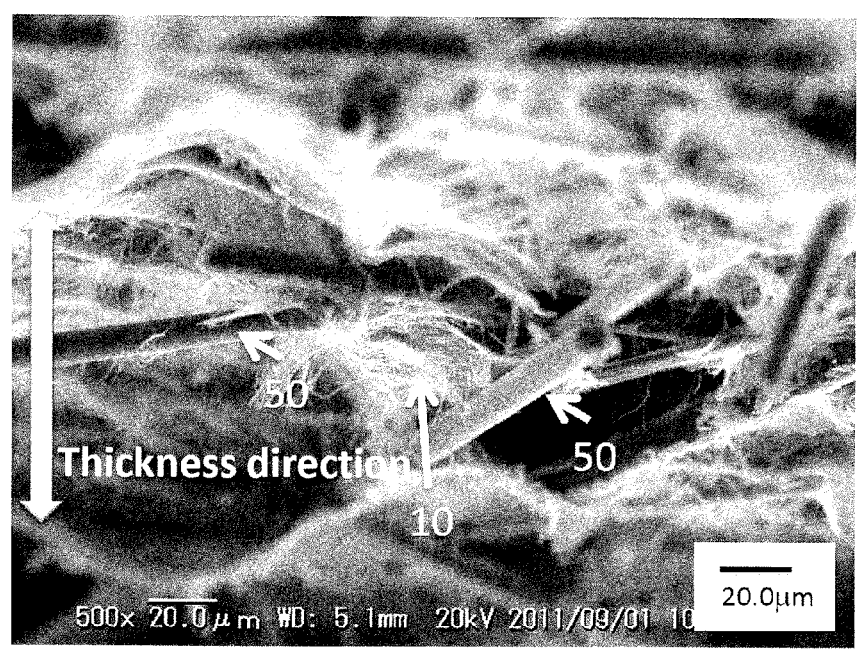
FIG. 5B is a SEM image of a fracture cross section of a carbon nanotube composite material 200 related to one embodiment at 500 times magnification.
Figure 6:
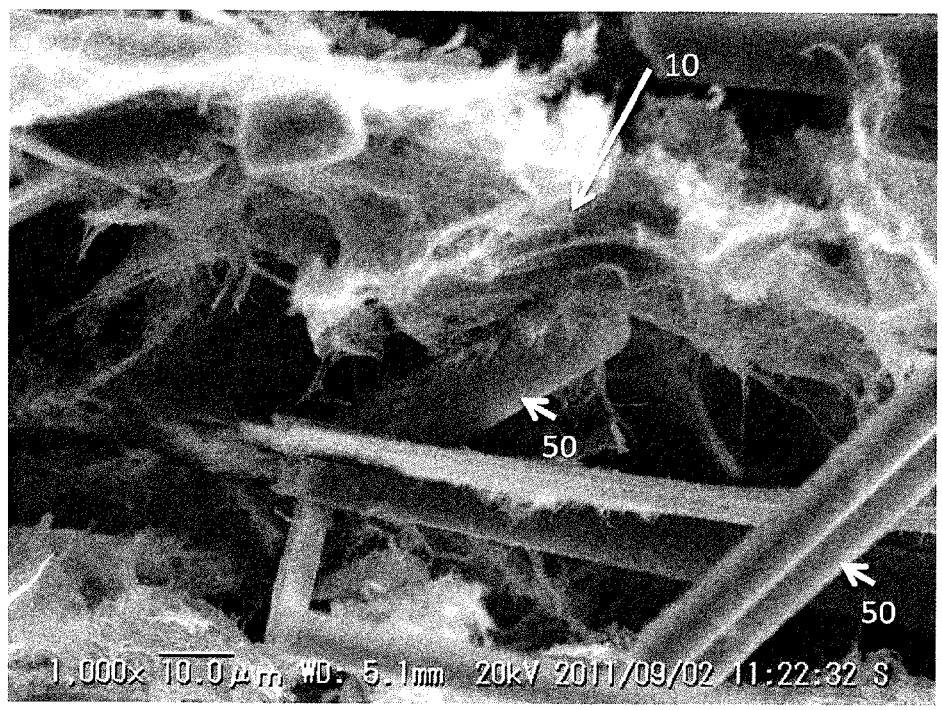
FIG. 6 is a SEM image at 1000 times magnification of a fracture cross section of the carbon nanotube composite material 200 related to one embodiment.
Figure 7A:
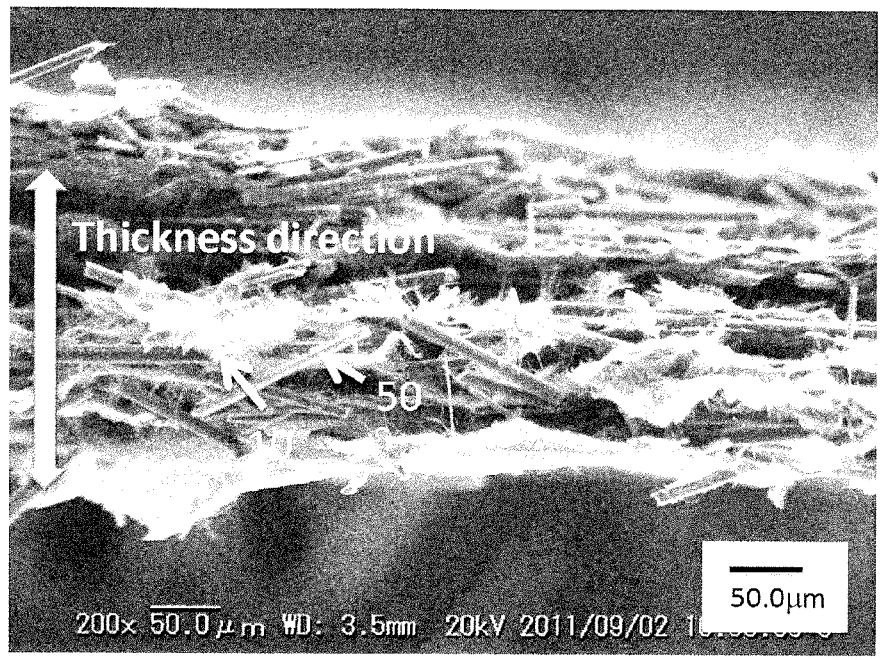
FIG. 7A is a SEM image of a fracture cross section of a carbon nanotube composite material 210 related to one embodiment at 200 times magnification (b) is at 500 times magnification.
Figure 7B:
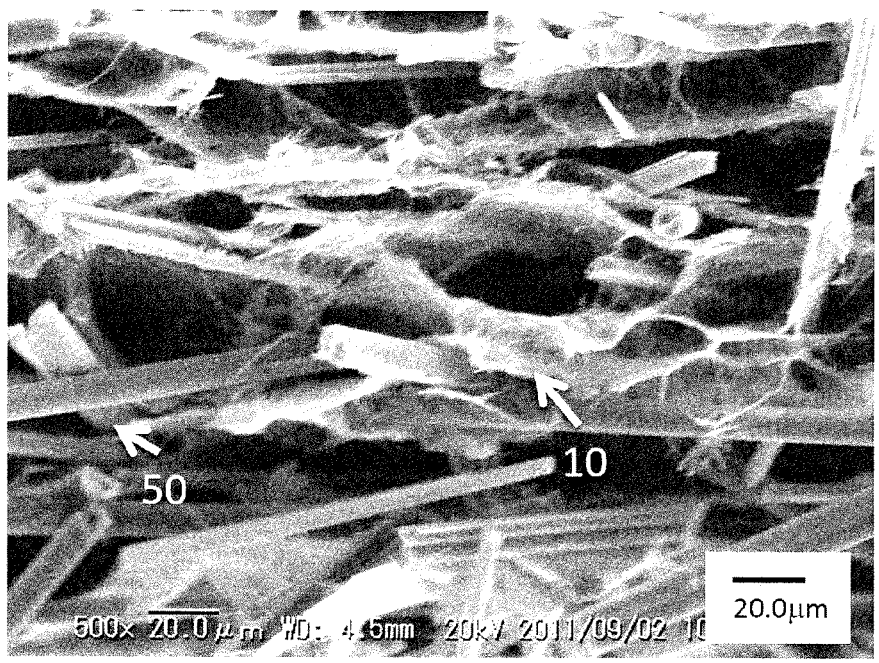
FIG. 7B is a SEM image of a fracture cross section of a carbon nanotube composite material 210 related to one embodiment at 500 times magnification.
Figure 8:
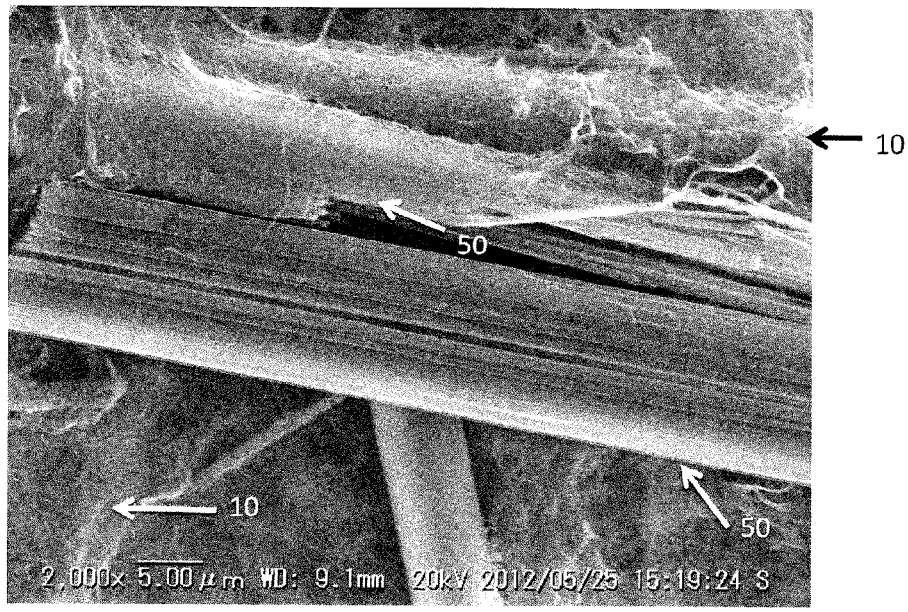
FIG. 8 is a SEM image at 2000 times magnification of a fracture cross section of a carbon nanotube composite material 260 related to one embodiment.
Figure 9:
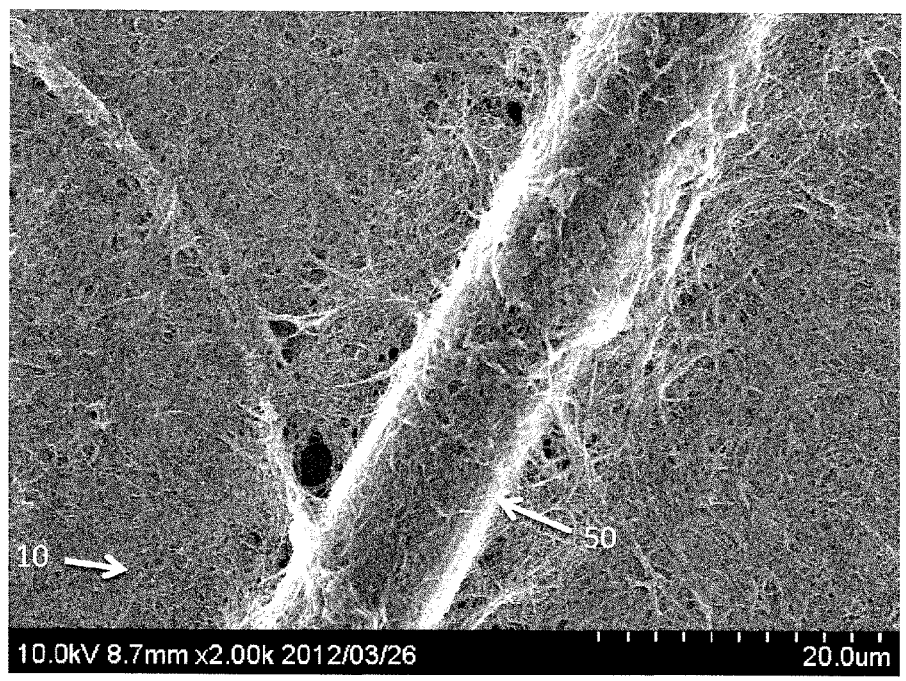
FIG. 9 is a SEM image at 2000 times magnification of a fracture cross section of a carbon nanotube composite material 260 related to one embodiment.
Figure 10:
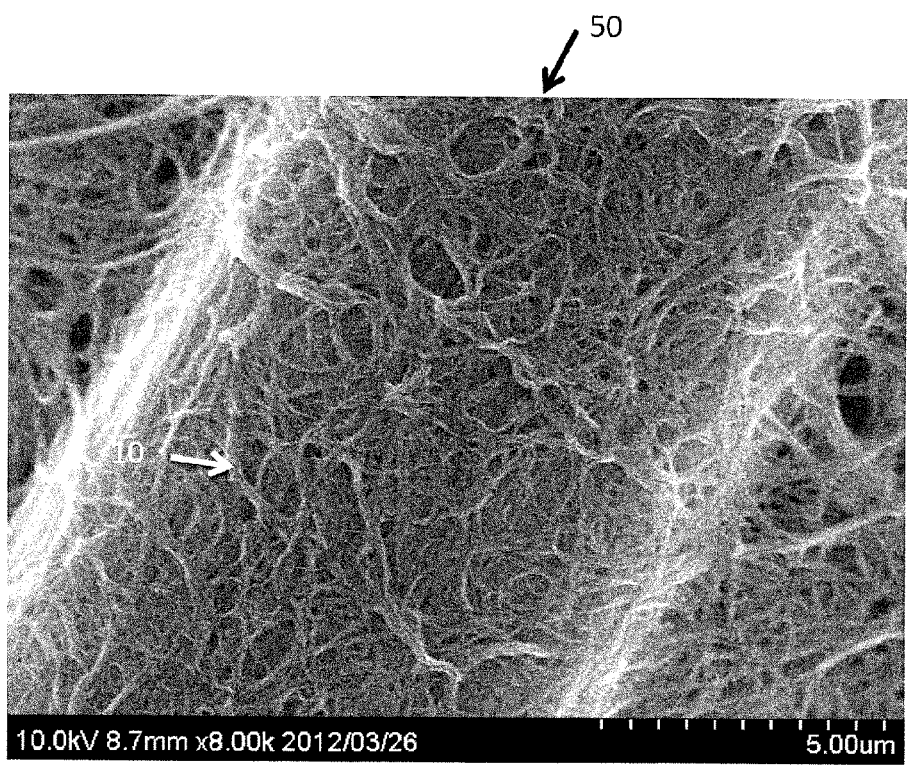
FIG. 10 is a SEM image at 8000 times magnification of a fracture cross section of the carbon nanotube composite material 260 related to one embodiment.
Figure 11A:
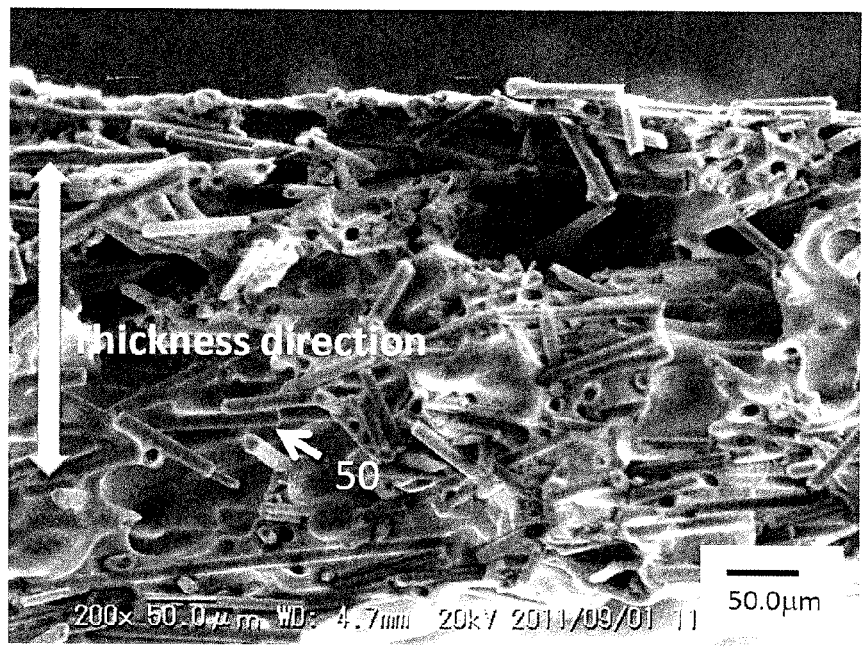
FIG. 11A is an SEM image of a fracture cross section of a composite material 910 of a comparative example at 200 times magnification.
Figure 11B:
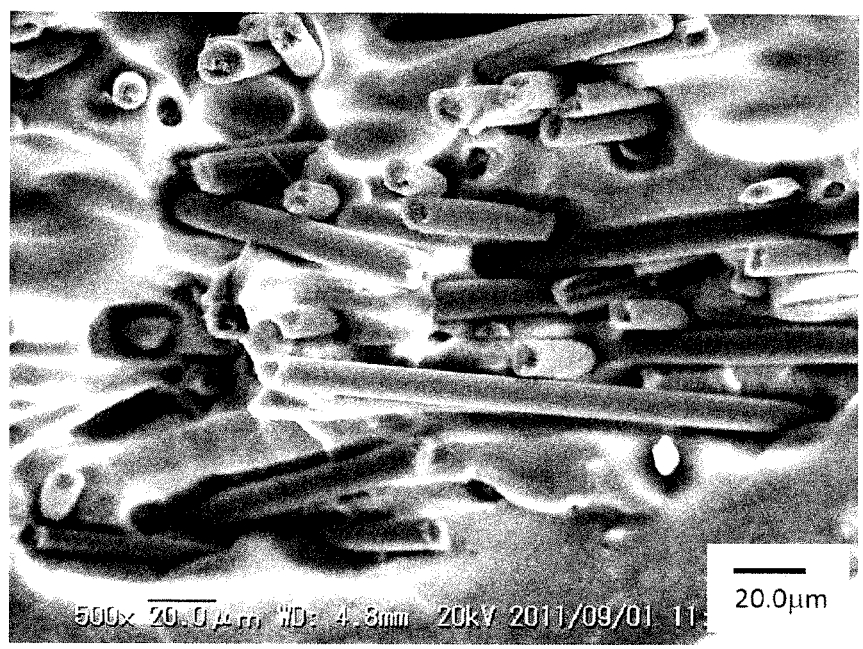
FIG. 11B is an SEM image of a fracture cross section of a composite material 910 of a comparative example at 500 times magnification.
Figure 12A:
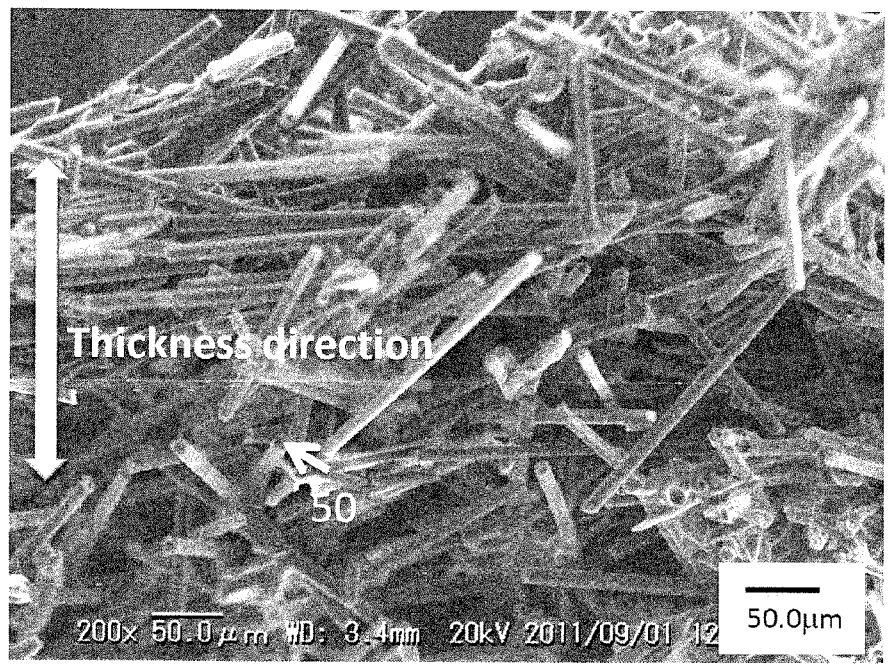
FIG. 12A is an SEM image of a fracture cross section of a composite material 950 of a comparative example, (a) is at 200 times magnification (b) is at 500 times magnification.
Figure 12B:
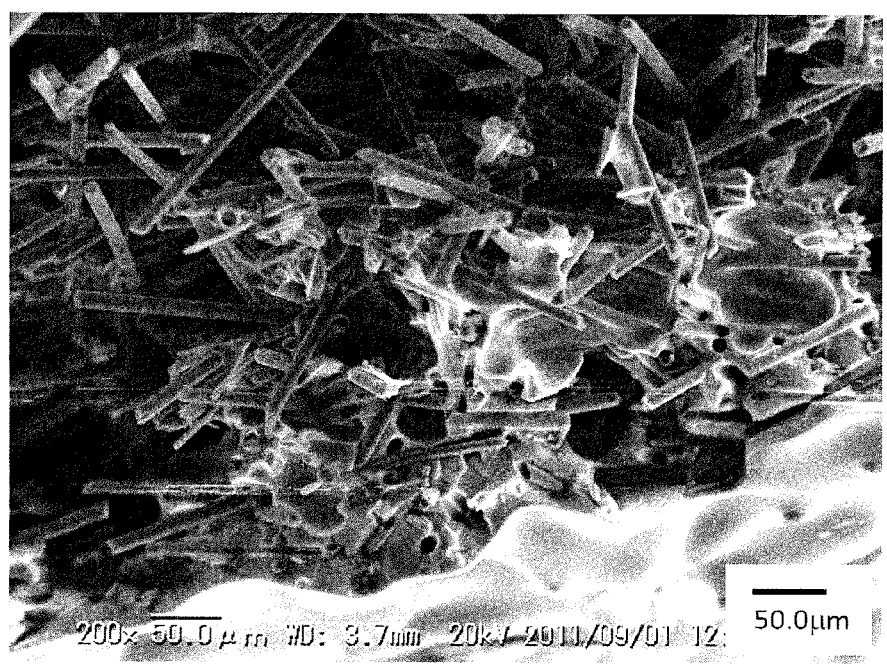
FIG. 12B is an SEM image of a fracture cross section of a composite material 950 of a comparative example, (a) is at 200 times magnification (b) is at 500 times magnification.

FIG. 5A is a SEM image of a fracture cross section of a carbon nanotube composite material 200 of Example 1 at 200 times magnification. FIG. 5B is a SEM image of a fracture cross section of a carbon nanotube composite material 200 of Example 1 at 500 times magnification. FIG. 6 is a SEM image at 1000 times magnification of a fracture cross section of the carbon nanotube composite material 200 of Example 1. FIG. 7A is a SEM image of a fracture cross section of a carbon nanotube composite material 210 of Example 2 at 200 times magnification. FIG. 7B is a SEM image of a fracture cross section of a carbon nanotube composite material 210 of Example 2 at 500 times magnification. FIG. 8 is a SEM image at 2000 times magnification of a fracture cross section of a carbon nanotube composite material 260 of Example 7. FIG. 9 is a SEM image at 2000 times magnification of a fracture cross section of a carbon nanotube composite material 260 of Example 7. FIG. 10 is an exploded SEM image at 8000 times magnification of a fracture cross section of the carbon nanotube composite material 260 of Example 7 in FIG. 9. FIG. 11A is an SEM image of a fracture cross section of a composite material 910 of Comparative Example 2 at 200 times magnification. FIG. 11B is an SEM image of a fracture cross section of a composite material 910 of Comparative Example 2 at 500 times magnification. FIG. 12A is an SEM image of a fracture cross section of a composite material 950 of Comparative Example 4 at 200 times magnification. FIG. 12B is an SEM image of a fracture cross section of a composite material 950 of Comparative Example 4 at 500 times magnification.

As shown in FIG. 5, in the fractured cross section of the carbon nanotube composite 200 of Example 1, a three-dimensional mesh structure of the CNT10 is observed, the carbon fibers 50 are supported by this mesh structure, and it can be confirmed that it is uniformly dispersed in the carbon nanotube composite material 200. In addition, even in the fractured cross section of the carbon nanotube composite material 210 of Example 2 shown in FIG. 7, similarly, the carbon fibers 50 are supported by a three-dimensional mesh structure, and it can be confirmed that it is uniformly dispersed in the carbon nanotube composite material 210. In this way, in the carbon nanotube composite material of the present embodiment, it is inferred that carbon fibers 50 are supported by CNT10 and at the same time contact between the carbon fibers 50 and the CNT10 provides a path which exhibits thermal conductivity.

In the present embodiment, CNT group 15 is arranged with a network structure (mesh structure, mesh body) in which a plurality of CNTs 10 (or a CNT bundle) and a CNT (or CNT bundle) 10 discreetly aggregate. The carbon nanotube composite material related to the present embodiment is arranged with mutually entangled CNTs which form a nonwoven cloth shape (film shape) and the CNT groups 15 form a layer shape by extending in the thickness direction of the carbon nanotube composite material in a perpendicular direction. The carbon nanotube composite material related to the present embodiment comprises carbon fibers 50 arranged in a layer shape between the CNT layers and/or pass through a CNT group 15. In addition, the carbon fibers 50 are arranged intersecting a direction (approximately perpendicular direction) with respect to the thickness direction.

The carbon nanotube composite material related to the present embodiment comprises the CNT group 15 which wraps around the carbon fibers 50, and/or is in contact, and/or is at least partially covered. In addition the carbon nanotube composite material related to the present embodiment is arranged with CNT groups 15 which connect and/or link and/or cross-link first carbon fibers 50 and second carbon fibers 50.

As shown in FIGS. 8 to 10, in the fractured cross section of the carbon nanotube composite material 260 of Example 7, a three-dimensional mesh structure of the CNT10 is observed, the carbon fibers 50 are supported by this mesh structure, and it can be confirmed that it is uniformly dispersed in the carbon nanotube composite material 200. In this way, in the carbon nanotube composite material of the present embodiment, it is inferred that carbon fibers 50 are supported by CNT10 and at the same time contact between the carbon fibers 50 and the CNT10 provides a path which exhibits thermal conductivity.

As can be better observed in FIG. 9 and FIG. 10, in the carbon nanotube composite 260 of Example 7, CNT group 15 comprises a network structure (mesh structure, mesh body) in which a plurality of CNTs 10 (or a CNT bundle) and a CNT (or CNT bundle) 10 discreetly aggregate. In particular, as can be seen from FIG. 10, in the CNT group with a plurality of "aggregated" CNTs 10, some CNTs 10 locally aggregate or separate, that is "discrete aggregation" is produced in which they have a "discrete" state.

The carbon nanotube composite material 260 of Example 7 comprises mutually entangled CNTs 10 which form a nonwoven cloth shape (film shape) and the CNT groups 15 form a layer shape by extending in a perpendicular direction with respect to the thickness direction of the carbon nanotube composite material. The carbon nanotube composite material 260 comprises carbon fibers 50 arranged in a layer shape between the CNT layers and/or pass through a CNT group 15. In addition, the carbon fibers 50 are arranged intersecting a direction (approximately perpendicular direction) with respect to the thickness direction.

The carbon nanotube composite material 260 comprises the CNT group 15 which wraps around the carbon fibers 50, and/or is in contact, and/or is provided with the CNT group 15 which is at least partially covered. In addition the carbon nanotube composite material 260 is arranged with CNT groups 15 which connect and/or link and/or cross-link first carbon fibers 50 and second carbon fibers 50.

However, as shown in FIG. 11, in the fractured cross section of the composite material 910 of the second comparative example, because the carbon fibers 50 are only embedded in the matrix 30, a path which exhibits thermal conductivity is provided only by contact between pairs of carbon fibers 50 and therefore it is assumed that the thermal conductivity becomes lower compared to the Examples. In the fractured cross section of the composite material 950 of Comparative Example 4 shown in FIG. 12, although the contact ratio between pairs of carbon fibers 50 is increased, because the three-dimensional mesh structure of CNT10 as in the Example does not exist, it is assumed that thermal conductivity is lower compared to the Examples.

[Thermal Conductivity]

Thermal conductivity was calculated with respect to the Examples and Comparative Examples. Thermal conductivity was calculated by measuring the thermal diffusivity and calculated from the thermal diffusivity obtained. Thermal conductivity was compared with respect to in-plane thermal conductivity and thickness direction thermal conductivity. When thermal conductivity is given as λ (W/mK), thermal diffusivity as α ($m^2$/S) and heat capacity as C (J/kgK), the following relationship is established.

$$\alpha = \frac{\lambda}{C} \quad [\text{FORMULA1}]$$

The measurement of the thermal diffusivity was performed using LFA447-Nanoflash manufactured by NETZSCH Inc. Furthermore, the heat capacity of fluorocarbon rubber was measured by measuring the specific heat capacity with sapphire as a control sample using a differential scanning calorimeter (X-DSC7000 manufactured by SII Nanotechnology Inc.) and measuring the density using a dry density meter (Akyubikku II1340 manufactured by Shimadzu Corporation) and using the product as the heat capacity.

In-plane thermal conductivity and the thickness direction thermal conductivity are summarized in FIGS. 13A and 13B. FIG. 13A is a table showing the characteristics of a carbon nanotube composite material related to Examples. FIG. 13B is a table showing the characteristics of a carbon nanotube Composite material related to comparative examples. As is shown in FIGS. 13A and 13B, in the carbon nanotube composite 200 of Example 1, the in-plane thermal conductivity was 23.5 W/mK, and the thickness direction thermal conductivity was 2.24 W/mK. In addition, in the carbon nanotube composite 210 of Example 2, the in-plane thermal conductivity was 19.3 W/mK, and the thickness direction thermal conductivity was 0.96 W/mK. In the carbon nanotube composite materials in Examples 3 to 9, in-plane thermal conductivity of 10 W/mK or more was shown, and in Example 7, an in-plane thermal conductivity of 105 W/mK was shown. On the other hand, in the composite material 900 of Comparative Example 1 containing no carbon fibers, in-plane thermal conductivity was 5.15 W/mK and thickness direction thermal conductivity was 0.046 W/mK which is significantly low compared to the Examples. In addition, in the composite material 910 of Comparative Example 2 containing no CNT, in-plane thermal conductivity was 5.49 W/mK and thickness direction thermal conductivity was 0.76 W/mK which is a significantly low value compared to the Examples. Thermal conductivity was still lower than the Examples even when the content of carbon fibers was increased in Comparative Example 4. Comparative Examples 5 to 8 also showed an extremely low in-plane thermal conductivity as compared to the Examples.

From the results of a SEM observation and thermal conductivity, it can be assumed that in the carbon nanotube composite materials of the Examples, the carbon fibers 50 are supported by the three dimensional mesh structure of the CNT10, and by uniformly dispersing in the carbon nanotube composite material 210, contact efficiency between the carbon fibers improved due to the CNT and a high thermal conductivity is achieved.

[Hardness Measurement]

Hardness was measured with respect to the Examples and Comparative examples. The hardness measurement was performed using a micro hardness tester HM2000 manufactured by Fischer Instruments.

The results of the hardness measurement are summarized in FIGS. 13A and 13B. It is important that the heating element and thermal conductor come into close contact in order to reduce the thermal resistance. As can be seen from FIGS. 13A and 13B, since the three-dimensional mesh structure of the CNT10 supports the carbon fibers 50, the carbon nanotube composite of the Examples is flexible compared to the composite material of the Comparative Example containing only carbon fibers 50 and showed that it is a material suitable for a thermal conductor.

[Surface Volume Resistivity]

Surface volume resistivity of both sides in the thickness direction was measured with respect to the Examples and Comparative Examples. The surface volume resistivity was measured using the resistivity meter Loresta GP MCP-T610 manufactured by Mitsubishi Chemical Analytech Co., Ltd.

The results of the surface volume resistivity measurement are summarized in FIGS. 13A and 13B. As is shown in FIGS. 13A and 13B, in the carbon nanotube composite material of Examples 1 and 2, the sheet resistance ratio was 1. On the other hand, in the composite material of Comparative Examples 2 to 4, the sheet resistance ratio was very large. Therefore, the carbon nanotube composite materials of the examples are evaluated as a material having excellent uniformity.

[Maximum Distribution of Differential Pore Volume]

A maximum distribution of differential pore volume was measured with respect to a carbon nanotube composite 200 of Example 1. 0.2083 g of a network structure composed from carbon fibers 50 and CNT groups 15 in which a matrix 30 was removed from the carbon nanotube composite 200 was used as a sample, the sample was dried at 115° C. for 3 hours. AutoPoreIV 9520 produced from Micoromeritics was used and a differential pore volume distribution was measured. In a range of 4 nm or more and 1000 μm or less of a pore diameter, the differential pore volume distribution was measured based on a Washburn method under a condition of 480.0 dynes/cm of mercury surface tension and 140.0° of contact angle.

Figure 14:
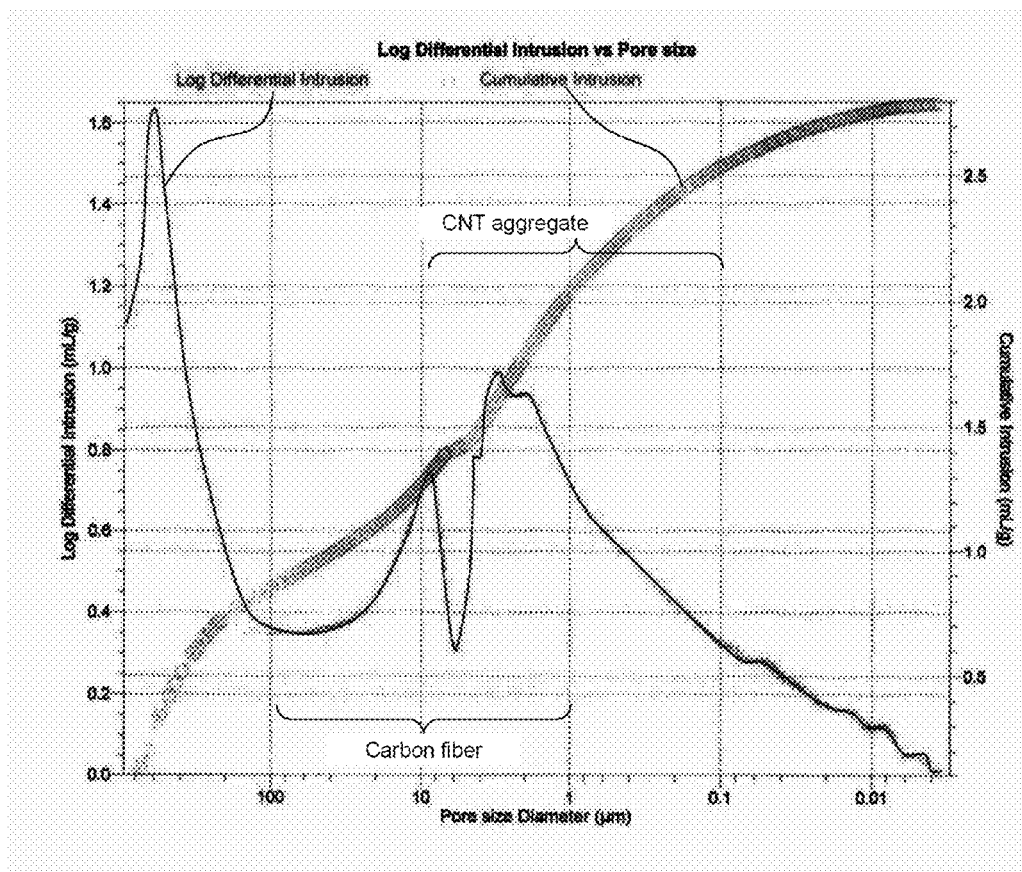
FIG. 14 is a measurement result of a differential pore volume distribution of the network structure extracted from the carbon nanotube composite related to one example.

FIG. 14 shows a measurement result of a differential pore volume distribution. As is clearly shown from FIG. 14, the carbon fibers 50 have a maximum distribution range of a differential pore volume of 1 μm or more and 100 μm or less in a range of 4 nm or more and 1000 μm or less of a pore diameter measured by the mercury intrusion porosimeter in the carbon nanotube composite 200 of Example 1. The carbon nanotube group has a maximum distribution range of a differential pore volume of 0.01 μm or more and 10 μm or less in a range of 4 nm or more and 1000 µm or less of a pore diameter measured by the mercury intrusion porosimeter.

[Specific Surface Area]

Figure 15:
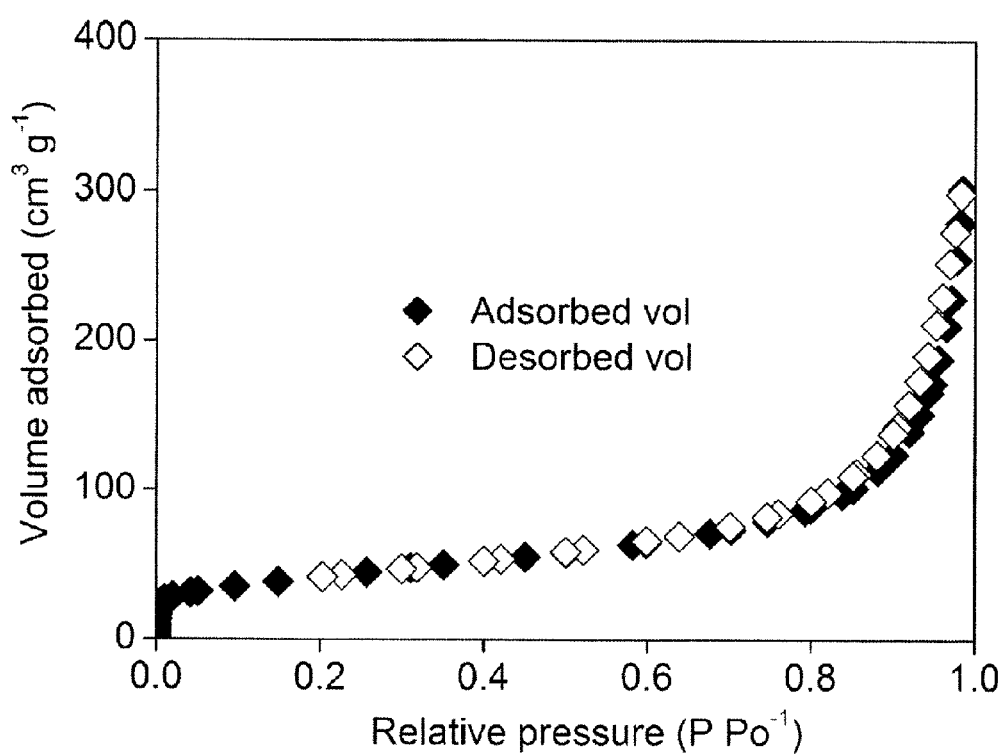
FIG. 15 shows a result of an absorption measurement of nitrogen to the network structure extracted from the carbon nanotube composite related to one example.

50 mg of a network structure extracted from the carbon nanotube composite 200 of Example 1 described above was used as a sample, the adsorption and desorption isotherms of liquid nitrogen at 77K was measured by using BELSORP-MINI (JAPAN BEL) (absorption equilibrium time was 600 seconds.). FIG. 15 shows a result of an absorption measurement of nitrogen to the network structure extracted from the carbon nanotube composite 200 of Example 1. From the calculation result of specific surface area based on the method of Brunauer, Emmett and Teller from the adsorption and desorption isotherms, a total specific surface area of the CNT aggregate and the carbon fibers 50 is 150 $m^2/g$.

As explained above, since the carbon fibers 50 are supported by a three-dimensional mesh structure of the CNT10 and is uniformly dispersed in the carbon nanotube composite material 210, the carbon nanotube composite material according to the present embodiment is a material with improved contact efficiency between the carbon fibers due to the CNT and a material with a high thermal conductivity is achieved.

According to the present invention, it is possible to realize a carbon nanotube composite material having excellent uniformity and a high thermal conductivity and a thermal conductor by dispersing carbon nanotubes and carbon fibers in a matrix.

The invention claimed is:

1. A carbon nanotube composite material having a carbon nanotube group with carbon nanotubes and carbon fibers dispersed in a matrix, wherein
    the carbon nanotubes provide 0.01 wt % or more and 30 wt % or less with respect to 100 wt % of the carbon nanotube composite material,
    the carbon nanotube group comprises a three dimensional network structure with a size of 10 µm or more observed by using a two-dimensional image,
    the carbon nanotube group enters between the carbon fibers and connects between the carbon fibers, and/or the carbon nanotube group links between the carbon fibers, and/or cross-links the carbon fibers between the carbon fibers, the carbon nanotube group enters between the carbon fibers and is arranged by being mutually entangled,
    the carbon nanotube group has a maximum distribution range of a differential pore volume of 0.01 µm or more and 10 µm or less in a range of 4 nm or more and 1000 µm or less of a pore diameter measured by a mercury intrusion porosimeter,
    the carbon fibers have a maximum distribution range of a differential pore volume of 1 µm or more and 100 µm or less in a range of 4 nm or more and 1000 µm or less of a pore diameter measured by a mercury intrusion porosimeter, and
    a total specific surface area of the carbon nanotube group and the carbon fibers measured by using the Brunauer, Emmett and Teller method is 10 $m^2/g$ or more and 500 $m^2/g$ or less.

2. The carbon nanotube composite material according to claim 1, wherein the carbon nanotube group has a nonwoven cloth shape and a layer shape by extending in an approximately perpendicular direction with respect to the thickness direction of the carbon nanotube composite.

3. The carbon nanotube composite material according to claim 1, wherein the carbon nanotube group supports the carbon fibers and sedimentation of the carbon fibers is prevented thereby.

* * * * *